United States Patent
Inoue et al.

(10) Patent No.: US 11,961,710 B2
(45) Date of Patent: *Apr. 16, 2024

(54) PLASMA PROCESSING APPARATUS

(71) Applicant: Canon Anelva Corporation, Kawasaki (JP)

(72) Inventors: Tadashi Inoue, Sagamihara (JP); Masaharu Tanabe, Fuchu (JP); Kazunari Sekiya, Hachioji (JP); Hiroshi Sasamoto, Tachikawa (JP); Tatsunori Sato, Hachioji (JP); Nobuaki Tsuchiya, Hamura (JP)

(73) Assignee: CANON ANELVA CORPORATION, Kawasaki (JP)

( * ) Notice: Subject to any disclaimer, the term of this patent is extended or adjusted under 35 U.S.C. 154(b) by 598 days.

This patent is subject to a terminal disclaimer.

(21) Appl. No.: 16/720,173

(22) Filed: Dec. 19, 2019

(65) Prior Publication Data

US 2020/0126764 A1    Apr. 23, 2020

Related U.S. Application Data

(63) Continuation of application No. PCT/JP2017/023603, filed on Jun. 27, 2017.

(51) Int. Cl.
*H01L 21/00*    (2006.01)
*C23C 14/34*    (2006.01)
(Continued)

(52) U.S. Cl.
CPC ........ *H01J 37/32183* (2013.01); *C23C 14/34* (2013.01); *C23C 14/54* (2013.01);
(Continued)

(58) Field of Classification Search
None
See application file for complete search history.

(56) References Cited

U.S. PATENT DOCUMENTS 4,014,779 A    3/1977 Kuehnle
4,025,339 A    5/1977 Kuehnle
(Continued)

FOREIGN PATENT DOCUMENTS

CN    1155748 A    7/1997
CN    1220931 A    6/1999
(Continued)

OTHER PUBLICATIONS

Extended European Search Report issued in European Patent Application No. 18 92 4031, dated Feb. 15, 2022, 1 (9 pages). European Patent Application No. 18 92 4031 corresponds to U.S. Appl. No. 17/023,675.

(Continued)

*Primary Examiner* — Sylvia Macarthur
*Assistant Examiner* — Michelle Crowell
(74) *Attorney, Agent, or Firm* — BUCHANAN INGERSOLL & ROONEY PC

(57) ABSTRACT

A plasma processing apparatus includes a balun having a first unbalanced terminal, a second unbalanced terminal, a first balanced terminal, and a second balanced terminal, a grounded vacuum container, a first electrode electrically connected to the first balanced terminal, a second electrode electrically connected to the second balanced terminal, an impedance matching circuit, a first power supply connected to the balun via the impedance matching circuit, and configured to supply a high frequency to the first electrode via the impedance matching circuit and the balun, a low-pass filter, and a second power supply configured to supply a voltage to the first electrode via the low-pass filter.

20 Claims, 14 Drawing Sheets

(51) Int. Cl.
*C23C 14/54* (2006.01)
*H01J 37/32* (2006.01)
*H01J 37/34* (2006.01)
*H03H 7/38* (2006.01)
*H03H 7/42* (2006.01)

(52) U.S. Cl.
CPC .. *H01J 37/32458* (2013.01); *H01J 37/32568* (2013.01); *H01J 37/32715* (2013.01); *H01J 37/3435* (2013.01); *H03H 7/38* (2013.01); *H03H 7/42* (2013.01); *H01J 2237/20214* (2013.01); *H01J 2237/20235* (2013.01); *H01J 2237/334* (2013.01)

(56) References Cited

U.S. PATENT DOCUMENTS

| | | | |
|---|---|---|---|
| 4,131,533 A | 12/1978 | Bialko et al. | |
| 4,170,475 A | 10/1979 | Hagenlocher et al. | |
| 4,284,489 A | 8/1981 | Weber | |
| 4,284,490 A | 8/1981 | Weber | |
| 4,584,079 A | 4/1986 | Lee et al. | |
| 4,802,080 A | 1/1989 | Bossi et al. | |
| 4,871,421 A | 10/1989 | Ogle et al. | |
| 4,887,005 A | 12/1989 | Rough et al. | |
| 4,956,582 A | 9/1990 | Bourassa | |
| 5,121,067 A | 6/1992 | Marsland | |
| 5,147,493 A * | 9/1992 | Nishimura | H01J 37/32082 204/298.34 |
| 5,169,509 A | 12/1992 | Latz et al. | |
| 5,316,645 A * | 5/1994 | Yamagami | C23C 14/3435 204/192.12 |
| 5,330,578 A * | 7/1994 | Sakama | C23C 16/4587 118/723 R |
| 5,415,757 A * | 5/1995 | Szcyrbowski | C23C 14/0036 204/192.12 |
| 5,464,499 A | 11/1995 | Moslehi et al. | |
| 5,611,899 A | 3/1997 | Maass | |
| 5,698,082 A | 12/1997 | Teschner et al. | |
| 5,718,815 A | 2/1998 | Szczyrbowski et al. | |
| 5,733,511 A | 3/1998 | De | |
| 5,755,938 A | 5/1998 | Fukui et al. | |
| 5,803,973 A | 9/1998 | Szczyrbowski et al. | |
| 5,807,470 A | 9/1998 | Szczyrbowski et al. | |
| 5,830,331 A | 11/1998 | Kim et al. | |
| 5,865,969 A | 2/1999 | Clarke | |
| 5,932,116 A | 8/1999 | Matsumoto et al. | |
| 5,989,999 A | 11/1999 | Levine et al. | |
| 5,990,016 A | 11/1999 | Kim et al. | |
| 6,017,221 A | 1/2000 | Flamm | |
| 6,046,641 A | 4/2000 | Chawla et al. | |
| 6,096,174 A | 8/2000 | Teschner et al. | |
| 6,150,826 A | 11/2000 | Hokodate et al. | |
| 6,239,404 B1 | 5/2001 | Lea et al. | |
| 6,252,354 B1 | 6/2001 | Collins et al. | |
| 6,273,022 B1 | 8/2001 | Pu et al. | |
| 6,422,172 B1 | 7/2002 | Tanaka et al. | |
| 6,517,912 B1 | 2/2003 | Morfill et al. | |
| 6,568,346 B2 | 5/2003 | Pu et al. | |
| 6,703,080 B2 | 3/2004 | Reyzelman et al. | |
| 6,818,103 B1 | 11/2004 | Scholl et al. | |
| 6,825,618 B2 | 11/2004 | Pu et al. | |
| 6,876,205 B2 | 4/2005 | Walde et al. | |
| 6,885,154 B2 | 4/2005 | Uchida et al. | |
| 6,913,703 B2 | 7/2005 | Strang et al. | |
| 7,032,536 B2 | 4/2006 | Fukuoka et al. | |
| 7,298,091 B2 | 11/2007 | Pickard et al. | |
| 7,445,690 B2 | 11/2008 | Kasai et al. | |
| 7,586,210 B2 | 9/2009 | Wiedemuth et al. | |
| 7,670,455 B2 | 3/2010 | Keller et al. | |
| 7,777,567 B2 | 8/2010 | Polizzo | |
| 8,033,246 B2 | 10/2011 | Wiedemuth et al. | |
| 8,293,068 B2 | 10/2012 | Koshimizu et al. | |
| 8,450,635 B2 | 5/2013 | Dhindsa | |
| 8,647,585 B2 | 2/2014 | Hancock | |
| 8,932,430 B2 | 1/2015 | Srivastava et al. | |
| 8,992,723 B2 | 3/2015 | Sorensen et al. | |
| 9,039,864 B2 | 5/2015 | Baek et al. | |
| 9,121,786 B2 | 9/2015 | Tie | |
| 9,147,555 B2 | 9/2015 | Richter | |
| 9,245,776 B2 | 1/2016 | Himori et al. | |
| 9,401,265 B2 | 7/2016 | Michel et al. | |
| 9,455,126 B2 | 9/2016 | Valcore et al. | |
| 9,564,360 B2 | 2/2017 | Akasaka et al. | |
| 9,607,810 B2 | 3/2017 | Valcore et al. | |
| 9,620,337 B2 | 4/2017 | Valcore et al. | |
| 9,640,367 B2 | 5/2017 | Keller et al. | |
| 9,675,716 B2 | 6/2017 | Hancock | |
| 9,779,196 B2 | 10/2017 | Valcore et al. | |
| 9,875,881 B2 | 1/2018 | Nagami et al. | |
| 10,081,869 B2 | 9/2018 | Augustyniak et al. | |
| 10,083,817 B1 | 9/2018 | Godyak | |
| 10,157,729 B2 | 12/2018 | Valcore, Jr. | |
| RE47,276 E | 3/2019 | Benjamin | |
| 10,224,463 B2 | 3/2019 | Daigo | |
| 10,231,321 B2 | 3/2019 | Valcore, Jr. et al. | |
| 10,354,838 B1 | 7/2019 | Mopidevi et al. | |
| 10,410,889 B2 | 9/2019 | Sadjadi et al. | |
| 10,544,505 B2 | 1/2020 | Yang et al. | |
| 10,553,406 B2 | 2/2020 | Chang et al. | |
| 10,685,810 B2 | 6/2020 | Mopidevi et al. | |
| 10,879,043 B2 | 12/2020 | Selmo | |
| 11,013,075 B2 | 5/2021 | Ester et al. | |
| 11,114,287 B2 | 9/2021 | Harris et al. | |
| 11,170,991 B2 | 11/2021 | Sakane | |
| 11,315,765 B2 | 4/2022 | Yamawaku et al. | |
| 2001/0054383 A1 | 12/2001 | Pu et al. | |
| 2002/0022836 A1 | 2/2002 | Goble et al. | |
| 2003/0087044 A1 | 5/2003 | Willms et al. | |
| 2003/0215373 A1 | 11/2003 | Reyzelman et al. | |
| 2004/0222184 A1* | 11/2004 | Hayami | H01J 37/32183 216/16 |
| 2004/0262156 A1 | 12/2004 | Seymour et al. | |
| 2005/0136604 A1 | 6/2005 | Al-bayati et al. | |
| 2005/0138577 A1 | 6/2005 | Adamian | |
| 2005/0160987 A1 | 7/2005 | Kasai et al. | |
| 2005/0258148 A1* | 11/2005 | Condrashoff | H01J 37/32183 219/121.43 |
| 2006/0032738 A1 | 2/2006 | Wiedemuth | |
| 2008/0050537 A1 | 2/2008 | Godyak | |
| 2008/0236750 A1* | 10/2008 | Koshimizu | B08B 7/0042 118/723 VE |
| 2008/0258411 A1 | 10/2008 | Miura et al. | |
| 2008/0308041 A1* | 12/2008 | Koshiishi | H01J 37/32082 118/715 |
| 2009/0041640 A1 | 2/2009 | Kasai et al. | |
| 2009/0075597 A1 | 3/2009 | Degani et al. | |
| 2009/0085597 A1 | 4/2009 | Burns et al. | |
| 2009/0102385 A1 | 4/2009 | Wi | |
| 2009/0117707 A1 | 5/2009 | Shimomura et al. | |
| 2009/0242135 A1 | 10/2009 | Koshimizu et al. | |
| 2010/0252199 A1 | 10/2010 | Marakhtanov et al. | |
| 2010/0294433 A1 | 11/2010 | Jianhui | |
| 2011/0300694 A1 | 12/2011 | Matsumoto et al. | |
| 2013/0017315 A1 | 1/2013 | Lai et al. | |
| 2013/0105082 A1 | 5/2013 | Melikyan et al. | |
| 2013/0337657 A1 | 12/2013 | Savas et al. | |
| 2014/0373783 A1 | 12/2014 | Sawada et al. | |
| 2015/0054405 A1 | 2/2015 | Nettesheim | |
| 2015/0165752 A1 | 6/2015 | Plach et al. | |
| 2015/0170882 A1 | 6/2015 | Yamawaku et al. | |
| 2015/0255258 A1 | 9/2015 | Nozawa et al. | |
| 2016/0240351 A1 | 8/2016 | Burgess et al. | |
| 2016/0289837 A1* | 10/2016 | Savas | C23C 16/545 |
| 2016/0307743 A1 | 10/2016 | Brown et al. | |
| 2016/0336084 A1 | 11/2016 | Laguardia et al. | |
| 2017/0018401 A1 | 1/2017 | Rudolph | |
| 2017/0084432 A1 | 3/2017 | Valcore et al. | |
| 2017/0213734 A9 | 7/2017 | Marakhtanov et al. | |
| 2017/0232122 A1 | 8/2017 | Hancock | |
| 2017/0338081 A1* | 11/2017 | Yamazawa | H01J 37/32091 |
| 2018/0130640 A1 | 5/2018 | Gregor et al. | |
| 2018/0269035 A1 | 9/2018 | Selmo | |
| 2018/0318459 A1 | 11/2018 | Hancock et al. | |

(56) References Cited

U.S. PATENT DOCUMENTS

| | | |
|---|---|---|
| 2019/0221405 A1 | 7/2019 | Yamawaku et al. |
| 2020/0126763 A1 | 4/2020 | Sekiya et al. |
| 2020/0126764 A1 | 4/2020 | Noue et al. |
| 2020/0126766 A1 | 4/2020 | Sekiya et al. |
| 2020/0126767 A1 | 4/2020 | Takeda et al. |
| 2020/0126768 A1 | 4/2020 | Inoue et al. |
| 2020/0161096 A1 | 5/2020 | Chang et al. |
| 2021/0005429 A1 | 1/2021 | Tanabe et al. |
| 2021/0118649 A1 | 4/2021 | Huh et al. |
| 2022/0051878 A1 | 2/2022 | Sekiya et al. |

FOREIGN PATENT DOCUMENTS

| | | |
|---|---|---|
| CN | 1390436 A | 1/2003 |
| CN | 2907173 Y | 5/2007 |
| CN | 101425456 A | 5/2009 |
| CN | 101478857 A | 7/2009 |
| CN | 101546697 A | 9/2009 |
| CN | 102479657 A | 5/2012 |
| CN | 103091042 A | 5/2013 |
| CN | 103094042 A | 5/2013 |
| CN | 104024471 A | 9/2014 |
| CN | 105887050 A | 8/2016 |
| CN | 106024568 A | 10/2016 |
| DE | 19713637 A1 | 10/1998 |
| EP | 1748687 A1 | 1/2007 |
| JP | S53-141937 | 11/1978 |
| JP | S53141937 U | 11/1978 |
| JP | S55035465 B2 | 9/1980 |
| JP | S 62133065 A | 6/1987 |
| JP | H02501608 A | 5/1990 |
| JP | H02156080 A | 6/1990 |
| JP | H02156081 A | 6/1990 |
| JP | H02156082 A | 6/1990 |
| JP | H02156083 A | 6/1990 |
| JP | H04-317325 A | 11/1992 |
| JP | H10261621 A | 9/1998 |
| JP | H11307299 A | 11/1999 |
| JP | 2000030896 A | 1/2000 |
| JP | 2000195851 A | 7/2000 |
| JP | 2000294543 A | 10/2000 |
| JP | 2001122690 A | 5/2001 |
| JP | 2001181848 A | 7/2001 |
| JP | 2001518230 A | 10/2001 |
| JP | 2002004040 A | 1/2002 |
| JP | 2002118101 | 4/2002 |
| JP | 2002141292 A | 5/2002 |
| JP | 2003512526 A | 4/2003 |
| JP | 2003155556 A | 5/2003 |
| JP | 2005026540 A | 1/2005 |
| JP | 2005130376 A | 5/2005 |
| JP | 2005303257 A | 10/2005 |
| JP | 2006336084 A | 12/2006 |
| JP | 2008294465 A | 12/2008 |
| JP | 2008300322 A | 12/2008 |
| JP | 2009021634 A | 1/2009 |
| JP | 2009105030 A | 5/2009 |
| JP | 2009302566 A | 12/2009 |
| JP | 2010045664 A | 2/2010 |
| JP | 2010109157 | 5/2010 |
| JP | 2010255061 A | 11/2010 |
| JP | 2011138907 A | 7/2011 |
| JP | 2011144450 A | 7/2011 |
| JP | 4909523 B2 | 4/2012 |
| JP | 2012142332 A | 7/2012 |
| JP | 2012174682 A | 9/2012 |
| JP | 2013139642 A | 7/2013 |
| JP | 2014049541 A | 3/2014 |
| JP | 2015115216 A | 6/2015 |
| JP | 5824072 B2 | 11/2015 |
| JP | 2016225376 A | 12/2016 |
| JP | 201721144 A | 11/2017 |
| JP | 6280677 B1 * | 2/2018 ........... C23C 16/505 |
| JP | 6280677 B1 | 2/2018 |
| JP | 6309683 B1 | 4/2018 |
| KR | 10-2014-0135202 A | 11/2014 |
| TW | 200741794 A | 11/2007 |
| TW | 201311059 A | 3/2013 |
| TW | 201423827 A | 6/2014 |
| TW | I492294 B | 7/2015 |
| TW | 201532220 A | 8/2015 |
| TW | 201643932 A | 12/2016 |
| TW | I560767 | 12/2016 |
| TW | I575107 B | 3/2017 |
| TW | I 601309 B | 10/2017 |
| WO | 8902695 A1 | 3/1989 |
| WO | 0129278 A1 | 4/2001 |
| WO | 0137619 A1 | 5/2001 |
| WO | 2010024128 A1 | 3/2010 |
| WO | 2010041679 A1 | 4/2010 |
| WO | 2012095961 A1 | 7/2012 |
| WO | 2019004191 A1 | 1/2019 |

OTHER PUBLICATIONS

International Search Report (PCT/ISA/210) and translation and Written Opinion (PCT/ISA/237) dated Sep. 11, 2018, by the Japanese Patent Office as the International Searching Authority for International Application No. PCT/JP2018/024150.

Supplemental European Search Report issued in corresponding European Patent Application No. 18824433, dated Apr. 1, 30, 2020 (8 pages).

International Search Report (PCT/ISA/210) and translation and Written Opinion (PCT/ISA/237) dated Sep. 19, 2017, by the Japanese Patent Office as the International Searching Authority for International Application No. PCT/JP2017/023603.

First Office Action dated Jun. 2, 2021, by the Chinese Patent Office in Chinese Patent Application No. 201880042465, and an English Translation of the Office Action. (23 pages).

First Office Action dated Jun. 2, 2021, by the Chinese Patent Office in Chinese Patent Application No. 201880042477.2, and an English Translation of the Office Action. (20 pages).

First Office Action dated Jun. 2, 2021, by the Chinese Patent Office in Chinese Patent Application No. 201780092518.4, and an English Translation of the Office Action. (21 pages).

First Office Action dated Jun. 2, 2021, by the Chinese Patent Office in Chinese Patent Application No. 201780092519.9, and an English Translation of the Office Action. (23 pages).

First Office Action dated Jun. 3, 2021, by the Chinese Patent Office in Chinese Patent Application No. 201880042506.5, and an English Translation of the Office Action. (21 pages).

Office Action (Notice of Preliminary Rejection) dated Apr. 19, 2021, by the Korean Patent Office in corresponding Korean Patent Application No. 10-2020-7001366, and an English Translation of the Office Action. (14 pages).

Office Action (Notice of Preliminary Rejection) dated Apr. 26, 2021, by the Korean Patent Office in corresponding Korean Patent Application No. 10-2020-7001366, and an English Translation of the Office Action. (9 pages).

Office Action (Grant of Patent) dated Apr. 27, 2021, by the Korean Patent Office in corresponding Korean Patent Application No. 10-2020-7001397, and an English Translation of the Office Action. (4 pages).

Office Action issued in U.S. Appl. No. 16/720,087, dated Apr. 7, 2022, (84 pages).

Supplemental European Search Report issued in corresponding European Patent Application No. 18823378.7, dated May 1, 25, 2020 (7 pages).

International Preliminary Report on Patentability (PCT/IPEA/409) received for PCT Patent Application No. PCT/JP2018/024145, dated Jul. 23, 2019, 10 pages of English Translation.

International Search Report (PCT/ISA/210) and Written Opinion (PCT/ISA/237) received for PCT Patent Application No. PCT/JP2018/047319, dated Mar. 12, 2019, 16 pages including 2 pages of English Translation.

Non Final Office Action received for U.S. Appl. No. 16/720,154, dated May 26, 2022, 16 pages.

(56) References Cited

OTHER PUBLICATIONS

Notice of Allowance received for U.S. Appl. No. 16/720,262, dated May 27, 2022, 8 pages.
Notice of Allowance received for U.S. Appl. No. 17/023,675, dated May 26, 2022, 12 pages.
Written Decision on Registration issued in Korean Patent Application No. 10-2020-7001366, dated Sep. 23, 1 2022, with English Translation (6 pages).
Office Action received for U.S. Appl. No. 16/720,154, dated Jan. 6, 2021, 27 pages.
Office Action received for U.S. Appl. No. 16/720,154, dated Mar. 15, 2021, 19 pages.
Notice of Allowance received for U.S. Appl. No. 16/720,154, dated Sep. 20, 2021, 16 pages.
Office Action received for U.S. Appl. No. 16/720,262, dated Sep. 22, 2021, 63 pages.
Office Action received for U.S. Appl. No. 16/720,156, dated Apr. 1, 2022, 19 pages.
Office Action received for U.S. Appl. No. 16/720,156, dated Oct. 25, 2021, 71 pages.
Office Action received for U.S. Appl. No. 17/023,675, dated Aug. 19, 2021, 35 pages.
Notice of Reasons for Refusal issued in corresponding Japanese Patent Application No. 2019-012426, dated Aug. 15, 2022, with English Translation (8 pages).
Notice of Reasons for Refusal issued in corresponding Japanese Patent Application No. 2019-012419, dated Aug. 15, 2022, with English Translation (14 pages).
Final Office Action issued in U.S. Appl. No. 16/720,087, dated Oct. 25, 2022 (36 pages).
Notification of the First Office Action issued in Chinese Patent Application No. 201880094963.9, dated Oct. 10, 2022, with English Translation (33 pages).

* cited by examiner

FIG. 4

| | | | | | | | | | | |
|---|---|---|---|---|---|---|---|---|---|---|
| TOTAL CURRENT I1 | 1 | 1 | 1 | 1 | 1 | 1 | 1 | 1 | 1 | 1 |
| CURRENT I2' | 1 | 0.9999 | 0.9997 | 0.999 | 0.997 | 0.99 | 0.97 | 0.9 | 0.68 | 0.55 | 0.29 |
| CURRENT I3 | 0 | 0.0001 | 0.0003 | 0.001 | 0.003 | 0.01 | 0.03 | 0.1 | 0.32 | 0.45 | 0.71 |
| ISO[dB]= 20log(I3/I2') | −∞ | −80.0 | −70.0 | −60.0 | −50.0 | −40.0 | −30.0 | −20.0 | −10.0 | −7.0 | −3.0 |
| α=X/Rp | ∞ | 5000 | 1582 | 500 | 158 | 50 | 15.8 | 5.0 | 1.5 | 1.0 | 0.5 |

PLASMA PROCESSING APPARATUS

CROSS-REFERENCE TO RELATED APPLICATION

This application is a continuation of International Patent Application No. PCT/JP2017/023603 filed Jun. 27, 2017, which is hereby incorporated by reference herein in its entirety.

TECHNICAL FIELD

The present invention relates to a plasma processing apparatus.

BACKGROUND ART

There is provided a plasma processing apparatus that generates plasma by applying a high frequency between two electrodes and processes a substrate by the plasma. Such plasma processing apparatus can operate as an etching apparatus or a sputtering apparatus by the bias and/or the area ratio of the two electrodes. The plasma processing apparatus configured as a sputtering apparatus includes the first electrode that holds a target and the second electrode that holds a substrate. A high frequency is applied between the first and second electrodes (between the target and the substrate), and plasma is generated between the target and an anode. When plasma is generated, a self-bias voltage is generated on the surface of the target. This causes ions to collide against the target, and the particles of a material constituting the target are discharged from the target.

PTL 1 describes a plasma processing apparatus including a grounded chamber, a target electrode connected to an RF source via impedance matching circuitry, and a substrate holding electrode grounded via a substrate electrode tuning circuit.

In the sputtering apparatus described in PTL 1, the chamber can function as an anode in addition to the substrate holding electrode. The self-bias voltage can depend on the state of a portion that can function as a cathode and the state of a portion that can function as an anode. Therefore, if the chamber functions as an anode in addition to the substrate holding unit electrode, the self-bias voltage can change depending on the state of a portion of the chamber that functions as an anode. The change in self-bias voltage changes a plasma potential, and the change in plasma potential can influence the characteristic of a film to be formed.

If a film is formed on a substrate using the sputtering apparatus, a film can also be formed on the inner surface of the chamber. This may change the state of the portion of the chamber that can function as an anode. Therefore, if the sputtering apparatus is continuously used, the self-bias voltage changes depending on the film formed on the inner surface of the chamber, and the plasma potential can also change. Consequently, if the sputtering apparatus is used for a long period, it is conventionally difficult to keep the characteristic of the film formed on the substrate constant.

Similarly, if the etching apparatus is used for a long period, the self-bias voltage changes depending on the film formed on the inner surface of the chamber, and this may change the plasma potential. Consequently, it is difficult to keep the etching characteristic of the substrate constant.

The sputtering apparatus described in PTL 1 needs to adjust a high-frequency power to control the self-bias voltage. However, if the high-frequency power is changed to adjust the self-bias voltage, a plasma density also changes. Consequently, it is conventionally impossible to individually adjust the self-bias voltage and the plasma density. Similarly, the etching apparatus cannot conventionally, individually adjust the self-bias voltage and the plasma density.

CITATION LIST

Patent Literature

PTL 1: Japanese Patent Publication No. 55-35465

SUMMARY OF INVENTION

Technical Problem

The present invention has been made based on the above problem recognition, and has as its object to provide a technique advantageous in stabilizing a plasma potential and in individually adjusting a voltage applied to an electrode and a plasma density.

According to one aspect of the present invention, there is provided a plasma processing apparatus comprising a balun including a first unbalanced terminal, a second unbalanced terminal, a first balanced terminal, and a second balanced terminal, a grounded vacuum container, a first electrode electrically connected to the first balanced terminal, a second electrode electrically connected to the second balanced terminal, an impedance matching circuit, a first power supply connected to the balun via the impedance matching circuit, and configured to supply a high frequency to the first electrode via the impedance matching circuit and the balun, a low-pass filter, and a second power supply configured to supply a voltage to the first electrode via the low-pass filter.

According to the present invention, there is provided a technique advantageous in stabilizing a plasma potential and in individually adjusting a voltage applied to an electrode and a plasma density.

BRIEF DESCRIPTION OF DRAWINGS

FIG. 4 is a table exemplifying the relationship among currents I1 (=I2), I2', and I3, ISO, and α(=X/Rp);

DESCRIPTION OF EMBODIMENTS

The present invention will be described below with reference to the accompanying drawings by way of exemplary embodiments.

Figure 1:
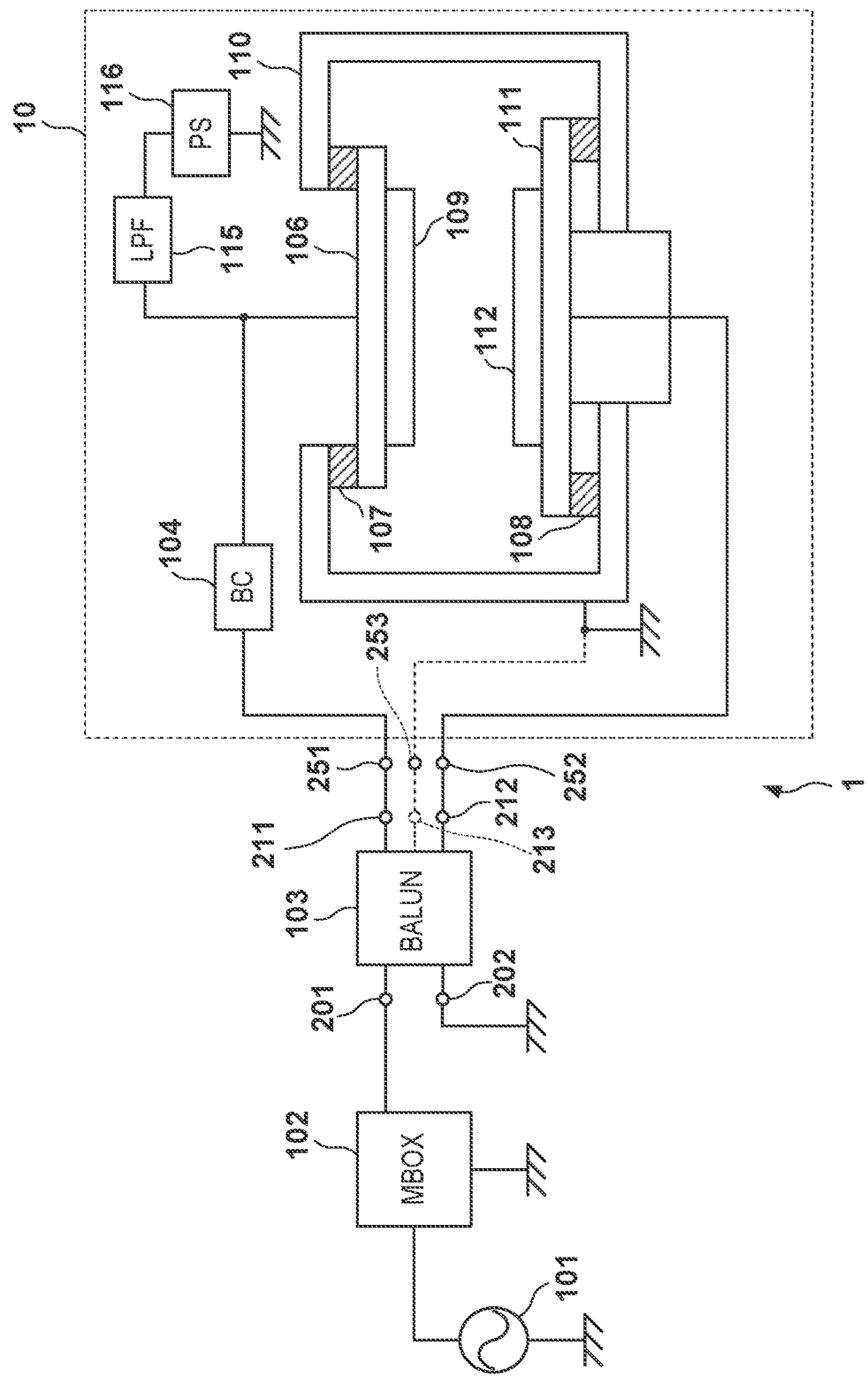
FIG. 1 is a circuit diagram schematically showing the arrangement of a plasma processing apparatus according to the first embodiment of the present invention.

FIG. 1 schematically shows the arrangement of a plasma processing apparatus 1 according to the first embodiment of the present invention. The plasma processing apparatus 1 includes a balun (balanced/unbalanced conversion circuit) 103, a vacuum container 110, a first electrode 106, a second electrode 111, a low-pass filter 115, and a power supply 116 (second power supply). Alternatively, it may be understood that the plasma processing apparatus 1 includes the balun 103 and a main body 10, and the main body 10 includes the vacuum container 110, the first electrode 106, the second electrode 111, the low-pass filter 115, and the power supply 116 (second power supply). The main body 10 includes a first terminal 251 and a second terminal 252. The power supply 116 can be, for example, a DC power supply or an AC power supply. The DC power supply may generate a DC voltage with an AC component. The main body 10 may include a third terminal 253 connected to the vacuum container 110. The plasma processing apparatus 1 can further include an impedance matching circuit 102 and a high-frequency power supply 101 (first power supply).

The balun 103 includes a first unbalanced terminal 201, a second unbalanced terminal 202, a first balanced terminal 211, and a second balanced terminal 212. An unbalanced circuit is connected to the first unbalanced terminal 201 and the second unbalanced terminal 202 of the balun 103, and a balanced circuit is connected to the first balanced terminal 211 and the second balanced terminal 212 of the balun 103. The vacuum container 110 is formed by a conductor, and is grounded. The balun 103 may further include a midpoint terminal 213. The balun 103 can be configured so that the voltage of the midpoint terminal 213 is set as the midpoint between the voltage of the first balanced terminal 211 and that of the second balanced terminal 212. The midpoint terminal 213 can electrically be connected to the third terminal 253 of the main body 10.

In the first embodiment, the first electrode 106 serves as a cathode, and holds a target 109. The target 109 can be, for example, an insulator material or a conductor material. Furthermore, in the first embodiment, the second electrode 111 serves as an anode, and holds a substrate 112. The plasma processing apparatus 1 according to the first embodiment can operate as a sputtering apparatus that forms a film on the substrate 112 by sputtering the target 109. The first electrode 106 is electrically connected to the first balanced terminal 211, and the second electrode 111 is electrically connected to the second balanced terminal 212. When the first electrode 106 and the first balanced terminal 211 are electrically connected to each other, this indicates that a current path is formed between the first electrode 106 and the first balanced terminal 211 so that a current flows between the first electrode 106 and the first balanced terminal 211. Similarly, in this specification, when a and b are electrically connected, this indicates that a current path is formed between a and b so that a current flows between a and b.

The above arrangement can be understood as an arrangement in which the first electrode 106 is electrically connected to the first terminal 251, the second electrode 111 is electrically connected to the second terminal 252, the first terminal 251 is electrically connected to the first balanced terminal 211, and the second terminal 252 is electrically connected to the second balanced terminal 212.

In the first embodiment, the first electrode 106 and the first balanced terminal 211 (first terminal 251) are electrically connected via a blocking capacitor 104. The blocking capacitor 104 blocks a DC current between the first balanced terminal 211 and the first electrode 106 (or between the first balanced terminal 211 and the second balanced terminal 212). Instead of providing the blocking capacitor 104, an impedance matching circuit 102 (to be described later) may be configured to block a DC current flowing between the first unbalanced terminal 201 and the second unbalanced terminal 202. The first electrode 106 can be supported by the vacuum container 110 via an insulator 107. The second electrode 111 can be supported by the vacuum container 110 via an insulator 108. Alternatively, the insulator 108 can be arranged between the second electrode 111 and the vacuum container 110.

The high-frequency power supply 101 (first power supply) supplies a high frequency (high-frequency current, high-frequency voltage, and high-frequency power) between the first unbalanced terminal 201 and the second unbalanced terminal 202 of the balun 103 via the impedance matching circuit 102. In other words, the high-frequency power supply 101 supplies a high frequency (high-frequency current, high-frequency voltage, and high-frequency power) between the first electrode 106 and the second electrode 111 via the impedance matching circuit 102, the balun 103, and the blocking capacitor 104. Alternatively, the high-frequency power supply 101 can be understood to supply a high frequency between the first terminal 251 and the second terminal 252 of the main body 10 via the impedance matching circuit 102 and the balun 103.

The power supply 116 (second power supply) can be configured to supply a negative DC voltage (bias voltage) or an AC voltage to the first electrode 106 via the low-pass filter 115. The low-pass filter 115 blocks a high frequency supplied from the balun 103 so as not to be transmitted to the power supply 116. By supplying a negative DC voltage or an AC voltage from the power supply 116 to the first electrode 106, it is possible to control (decide) the voltage of the surface of the target 109 or ion energy colliding against the surface of the target 109. If the target 109 is made of a conductive material, it is possible to control the voltage of the surface of the target 109 by supplying a negative DC voltage from the power supply 116 to the first electrode 106. If the target 109 is made of an insulating material, it is possible to control ion energy colliding against the surface of the target 109 by supplying an AC voltage from the power supply 116 to the first electrode 106.

If the target 109 is made of an insulating material, and the power supply 116 (second power supply) supplies an AC voltage to the first electrode 106, the frequency of the voltage supplied from the power supply 116 to the first electrode 106 can be set lower than the frequency of the high frequency generated by the high-frequency power supply 101 (first power supply). In this case, the frequency of the voltage supplied from the power supply 116 to the first electrode 106 is preferably set within a range of several hundred KHz to several MHz.

A gas (for example, Ar, Kr, or Xe gas) is supplied to the internal space of the vacuum container 110 through a gas supply unit (not shown) provided in the vacuum container 110. In addition, the high-frequency power supply 101 (first power supply) supplies a high frequency between the first electrode 106 and the second electrode 111 via the impedance matching circuit 102, the balun 103, and the blocking capacitor 104. In addition, the power supply 116 supplies a negative DC voltage or an AC voltage to the first electrode 106 via the low-pass filter 115. This generates plasma between the first electrode 106 and the second electrode 111, and the surface of the target 109 is controlled to a negative voltage or ion energy colliding against the surface of the target 109 is controlled. Then, ions in the plasma collide against the surface of the target 109, and the particles of the material constituting the target 109 are discharged from the target 109. The particles form a film on the substrate 112.

Figure 2A:
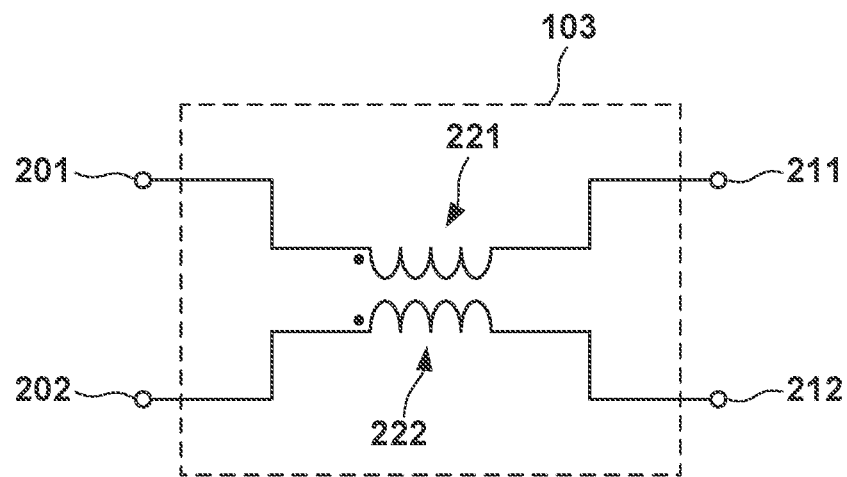
FIG. 2A is a circuit diagram showing an example of the arrangement of a balun.

FIG. 2A shows an example of the arrangement of the balun 103. The balun 103 shown in FIG. 2A includes a first coil 221 that connects the first unbalanced terminal 201 and the first balanced terminal 211, and a second coil 222 that connects the second unbalanced terminal 202 and the second balanced terminal 212. The first coil 221 and the second coil 222 are coils having the same number of turns, and share an iron core.

Figure 2B:
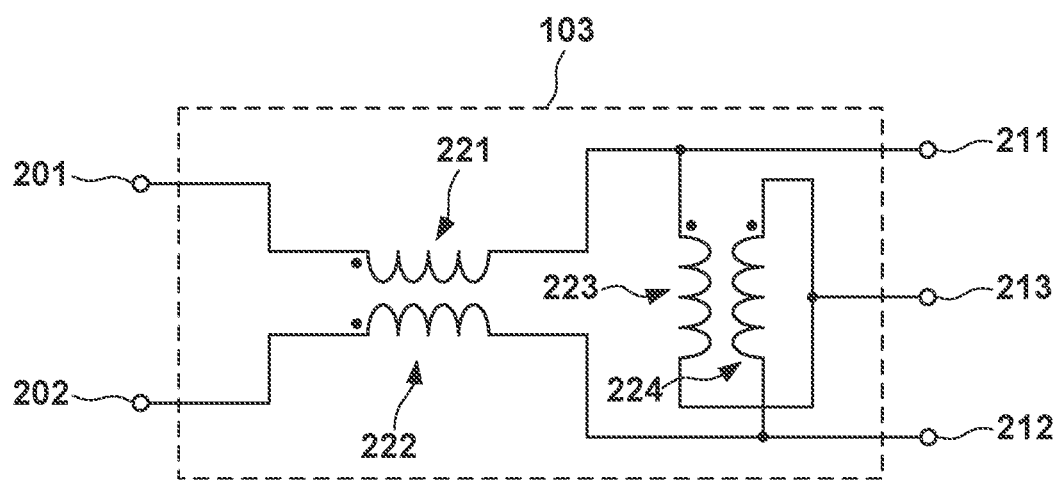
FIG. 2B is a circuit diagram showing another example of the arrangement of the balun.

FIG. 2B shows another example of the arrangement of the balun 103. The balun 103 shown in FIG. 2B includes a first coil 221 that connects the first unbalanced terminal 201 and the first balanced terminal 211, and a second coil 222 that connects the second unbalanced terminal 202 and the second balanced terminal 212. The first coil 221 and the second coil 222 are coils having the same number of turns, and share an iron core. The balun 103 shown in FIG. 2B further includes a third coil 223 and a fourth coil 224 both of which are connected between the first balanced terminal 211 and the second balanced terminal 212. The third coil 223 and the fourth coil 224 are configured so that a connection node of the third coil 223 and the fourth coil 224 is set as the midpoint between the voltage of the first balanced terminal 211 and that of the second balanced terminal 212. The connection node is connected to the midpoint terminal 213. The third coil 223 and the fourth coil 224 are coils having the same number of turns, and share an iron core. The midpoint terminal 213 may be grounded, may be connected to the vacuum container 110, or may be floated.

The function of the balun 103 will be described with reference to FIG. 3. Let I1 be a current flowing through the first unbalanced terminal 201, I2 be a current flowing through the first balanced terminal 211, I2' be a current flowing through the second unbalanced terminal 202, and I3 be a current, of the current I2, flowing to ground. When I3=0, that is, no current flows to ground on the balanced circuit side, the isolation performance of the balanced circuit with respect to ground is highest. When I3=I2, that is, all the current I2 flowing through the first balanced terminal 211 flows to ground, the isolation performance of the balanced circuit with respect to ground is lowest. An index ISO representing the degree of the isolation performance is given by:

$$\text{ISO[dB]}=20\ \log(I3/I2')$$

Under this definition, as the absolute value of the index ISO is larger, the isolation performance is higher.

Figure 3:
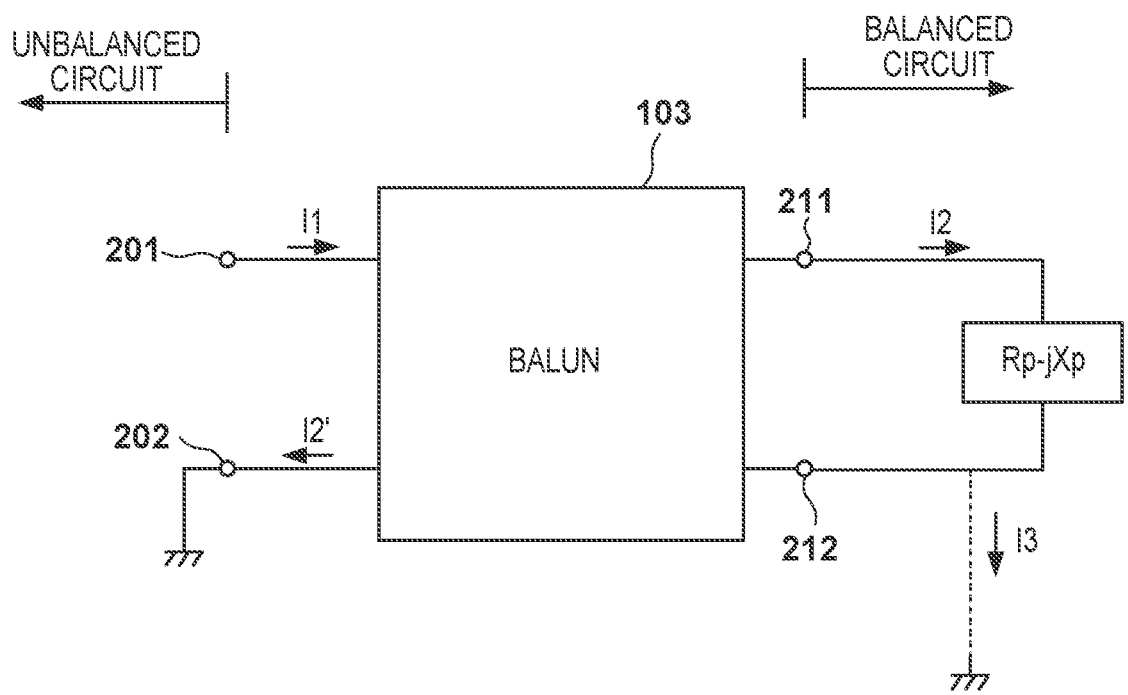
FIG. 3 is a circuit diagram for explaining the function of a balun 103.

In FIG. 3, Rp−jXp represents an impedance (including the reactance of the blocking capacitor 104) when viewing the side of the first electrode 106 and the second electrode 111 (the side of the main body 10) from the side of the first balanced terminal 211 and the second balanced terminal 212 in a state in which plasma is generated in the internal space of the vacuum container 110. Note that this impedance is an impedance at the frequency of the high frequency generated by the high-frequency power supply 101, and the impedances of the low-pass filter 115 and the power supply 116 are negligible. Rp represents a resistance component, and −Xp represents a reactance component. Furthermore, in FIG. 3, X represents the reactance component (inductance component) of the impedance of the first coil 221 of the balun 103. ISO has a correlation with X/Rp.

To clarify the advantage of the arrangement in which the high-frequency power supply 101 supplies the high frequency between the first electrode 106 and the second electrode 111 via the balun 103, the operation of the plasma processing apparatus 1 in a state in which the power supply 116 (and the low-pass filter 115) is detached from the plasma processing apparatus 1 (main body 10) will be described. FIG. 4 exemplifies the relationship among the currents I1 (=I2), I2', and I3, ISO, and a (=X/Rp) in the state in which the power supply 116 (and the low-pass filter 115) is detached from the plasma processing apparatus 1 (main body 10).

The present inventor found that when $1.5 \leq X/Rp \leq 5000$ is satisfied, the potential (plasma potential) of plasma formed in the internal space (the space between the first electrode 106 and the second electrode 111) of the vacuum container 110 is insensitive to the state of the inner surface of the vacuum container 110. When the plasma potential is insensitive to the state of the inner surface of the vacuum container 110, this indicates that it is possible to stabilize the plasma potential even if the plasma processing apparatus 1 is used for a long period. $1.5 \leq X/Rp \leq 5000$ corresponds to $-10.0\ \text{dB} \geq \text{ISO} \geq -80\ \text{dB}$.

Figure 5A:
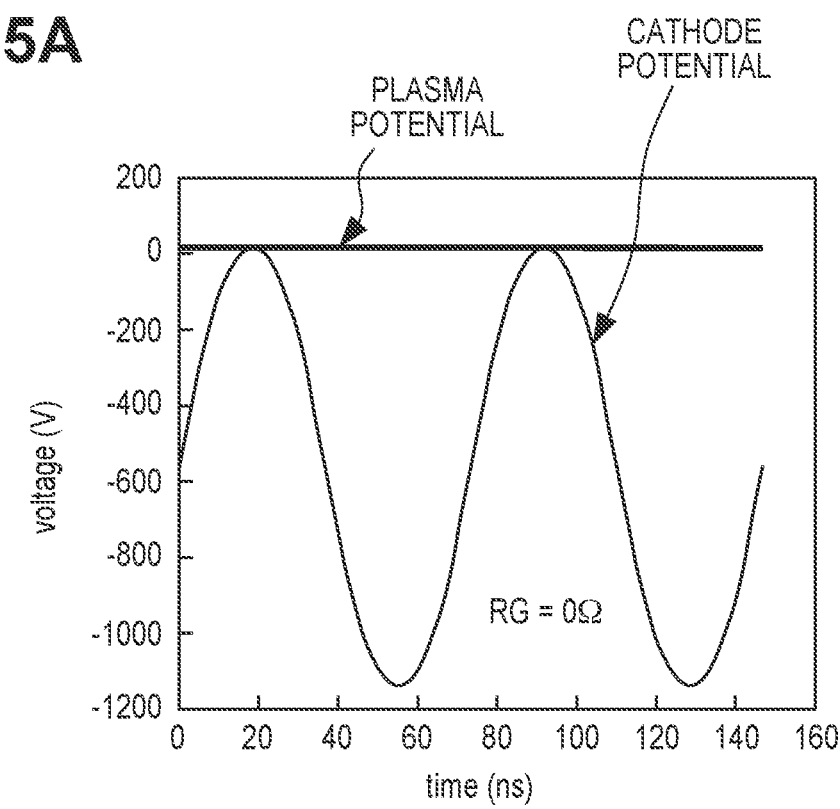
FIG. 5A is a timing chart showing a result of simulating a plasma potential and a cathode potential when $1.5 \leq X/Rp \leq 5000$ is satisfied.
Figure 5B:
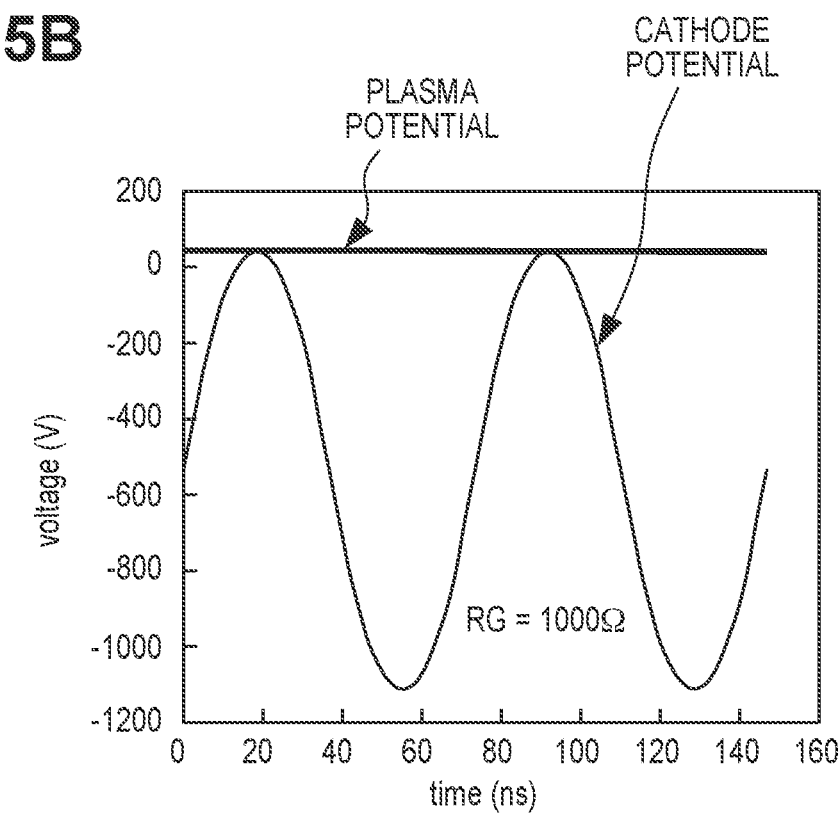
FIG. 5B is a timing chart showing a result of simulating a plasma potential and a cathode potential when $1.5 \leq X/Rp \leq 5000$ is satisfied.
Figure 5C:
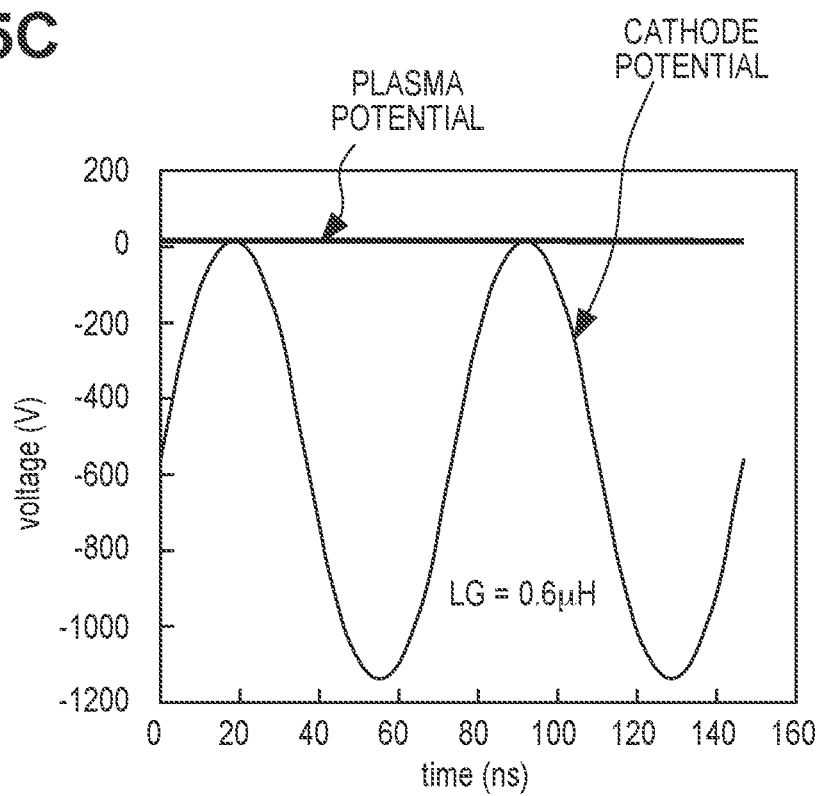
FIG. 5C is a timing chart showing a result of simulating a plasma potential and a cathode potential when $1.5 \leq X/Rp \leq 5000$ is satisfied.
Figure 5D:
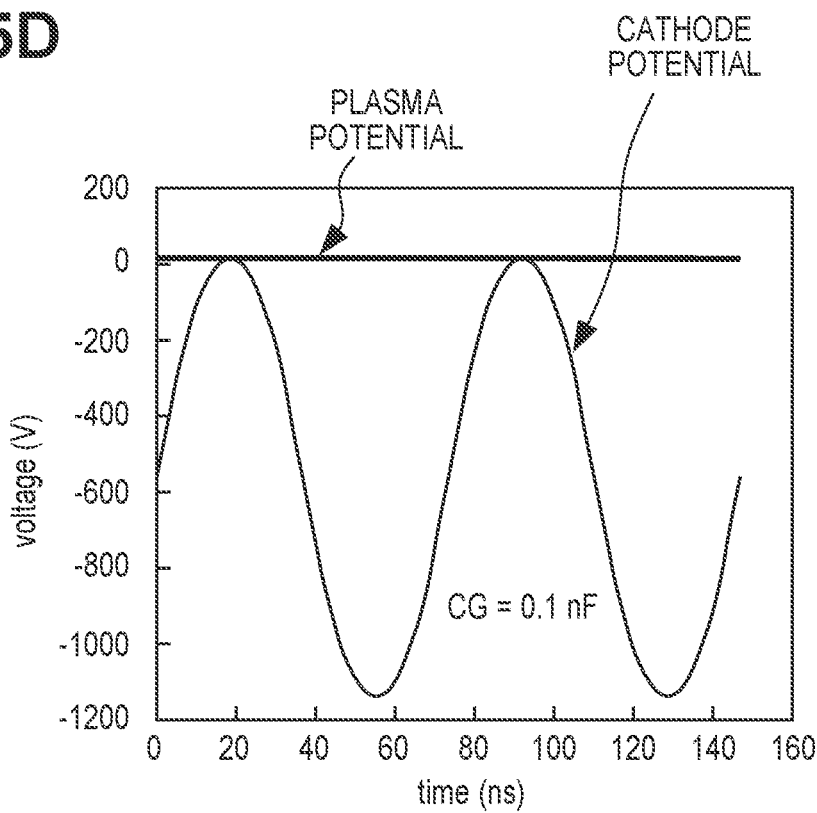
FIG. 5D is a timing chart showing a result of simulating a plasma potential and a cathode potential when $1.5 \leq X/Rp \leq 5000$ is satisfied.

FIGS. 5A to 5D each show a result of simulating the plasma potential and the potential (cathode potential) of the first electrode 106 when $1.5 \leq X/Rp \leq 5000$ is satisfied. FIG. 5A shows the plasma potential and the cathode potential in a state in which no film is formed on the inner surface of the vacuum container 110. FIG. 5B shows the plasma potential and the cathode potential in a state in which a resistive film (1,000Ω) is formed on the inner surface of the vacuum container 110. FIG. 5C shows the plasma potential and the cathode potential in a state in which an inductive film (0.6 μH) is formed on the inner surface of the vacuum container 110. FIG. 5D shows the plasma potential and the cathode potential in a state in which a capacitive film (0.1 nF) is formed on the inner surface of the vacuum container 110. With reference to FIGS. 5A to 5D, it is understood that when $1.5 \leq X/Rp \leq 5000$ is satisfied, the plasma potential is stable in various states of the inner surface of the vacuum container 110.

Figure 6A:
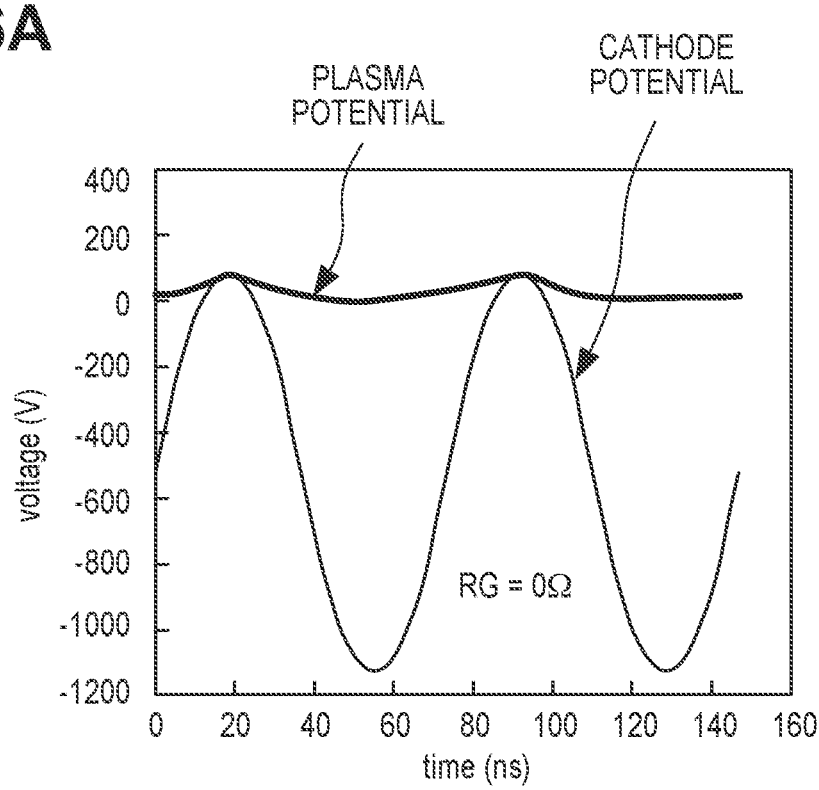
FIG. 6A is a timing chart showing a result of simulating a plasma potential and a cathode potential when $1.5 \leq X/Rp \leq 5000$ is not satisfied.
Figure 6B:
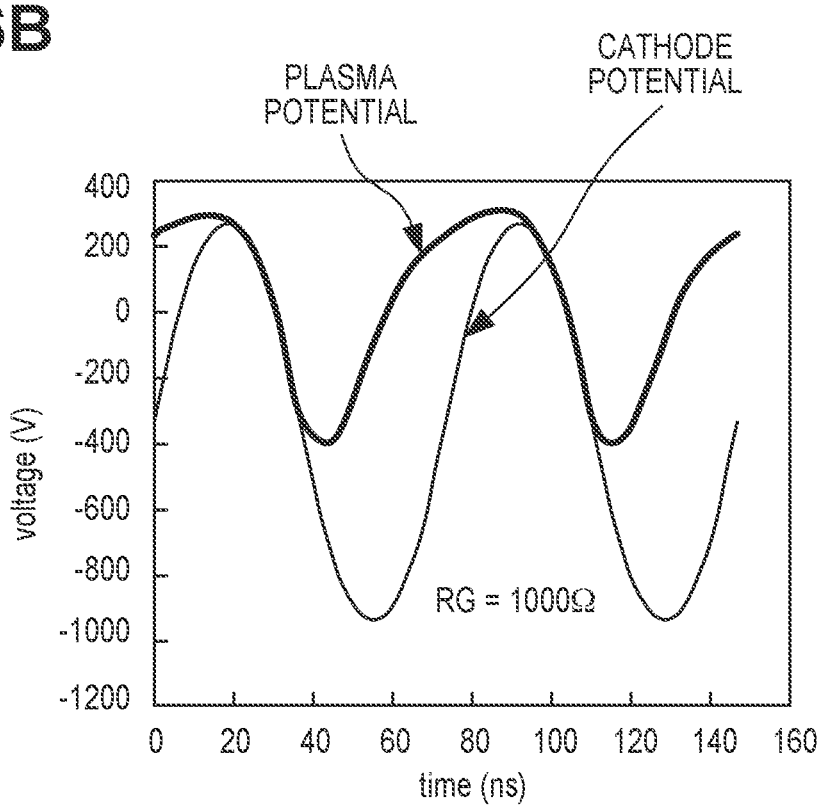
FIG. 6B is a timing chart showing a result of simulating a plasma potential and a cathode potential when $1.5 \leq X/Rp \leq 5000$ is not satisfied.
Figure 6C:
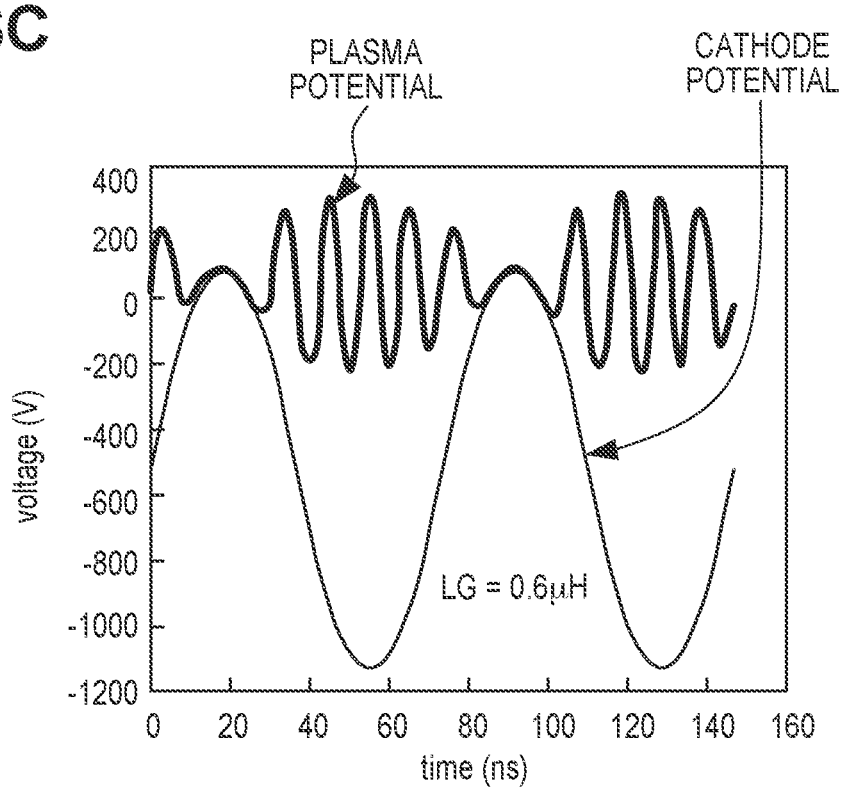
FIG. 6C is a timing chart showing a result of simulating a plasma potential and a cathode potential when $1.5 \leq X/Rp \leq 5000$ is not satisfied.
Figure 6D:
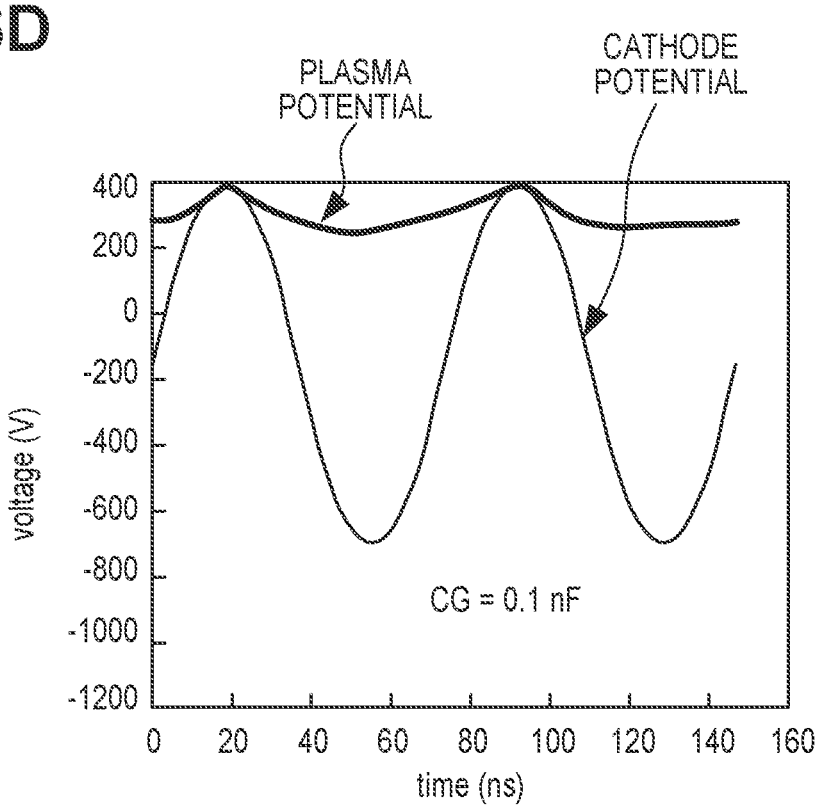
FIG. 6D is a timing chart showing a result of simulating a plasma potential and a cathode potential when $1.5 \leq X/Rp \leq 5000$ is not satisfied.

FIGS. 6A to 6D each show a result of simulating the plasma potential and the potential (cathode potential) of the first electrode 116 when $1.5 \leq X/Rp \leq 5000$ is not satisfied. FIG. 6A shows the plasma potential and the cathode potential in a state in which no film is formed on the inner surface of the vacuum container 110. FIG. 6B shows the plasma potential and the cathode potential in a state in which a resistive film (1,000Ω) is formed on the inner surface of the vacuum container 110. FIG. 6C shows the plasma potential and the cathode potential in a state in which an inductive film (0.6 μH) is formed on the inner surface of the vacuum container 110. FIG. 6D shows the plasma potential and the cathode potential in a state in which a capacitive film (0.1 nF) is formed on the inner surface of the vacuum container 110. With reference to FIGS. 6A to 6D, it is understood that when $1.5 \leq X/Rp \leq 5000$ is not satisfied, the plasma potential changes depending on the state of the inner surface of the vacuum container 110.

In both the case in which $X/Rp>5000$ (for example, $X/Rp=\infty$) is satisfied and the case in which $X/Rp<1.5$ (for example, $X/Rp=1.0$ or $X/Rp=0.5$) is satisfied, the plasma potential readily changes depending on the state of the inner surface of the vacuum container 110. If $X/Rp>5000$ is satisfied, in a state in which no film is formed on the inner surface of the vacuum container 110, discharge occurs only between the first electrode 106 and the second electrode 111. However, if $X/Rp>5000$ is satisfied, when a film starts to be formed on the inner surface of the vacuum container 110, the plasma potential sensitively reacts to this, and the results exemplified in FIGS. 6A to 6D are obtained. On the other hand, when $X/Rp<1.5$ is satisfied, a current flowing to ground via the vacuum container 110 is large. Therefore, the influence of the state of the inner surface of the vacuum container 110 (the electrical characteristic of a film formed on the inner surface) is conspicuous, and the plasma potential changes depending on formation of a film. Thus, as described above, the plasma processing apparatus 1 should be configured to satisfy $1.5 \leq X/Rp \leq 5000$.

Figure 7:
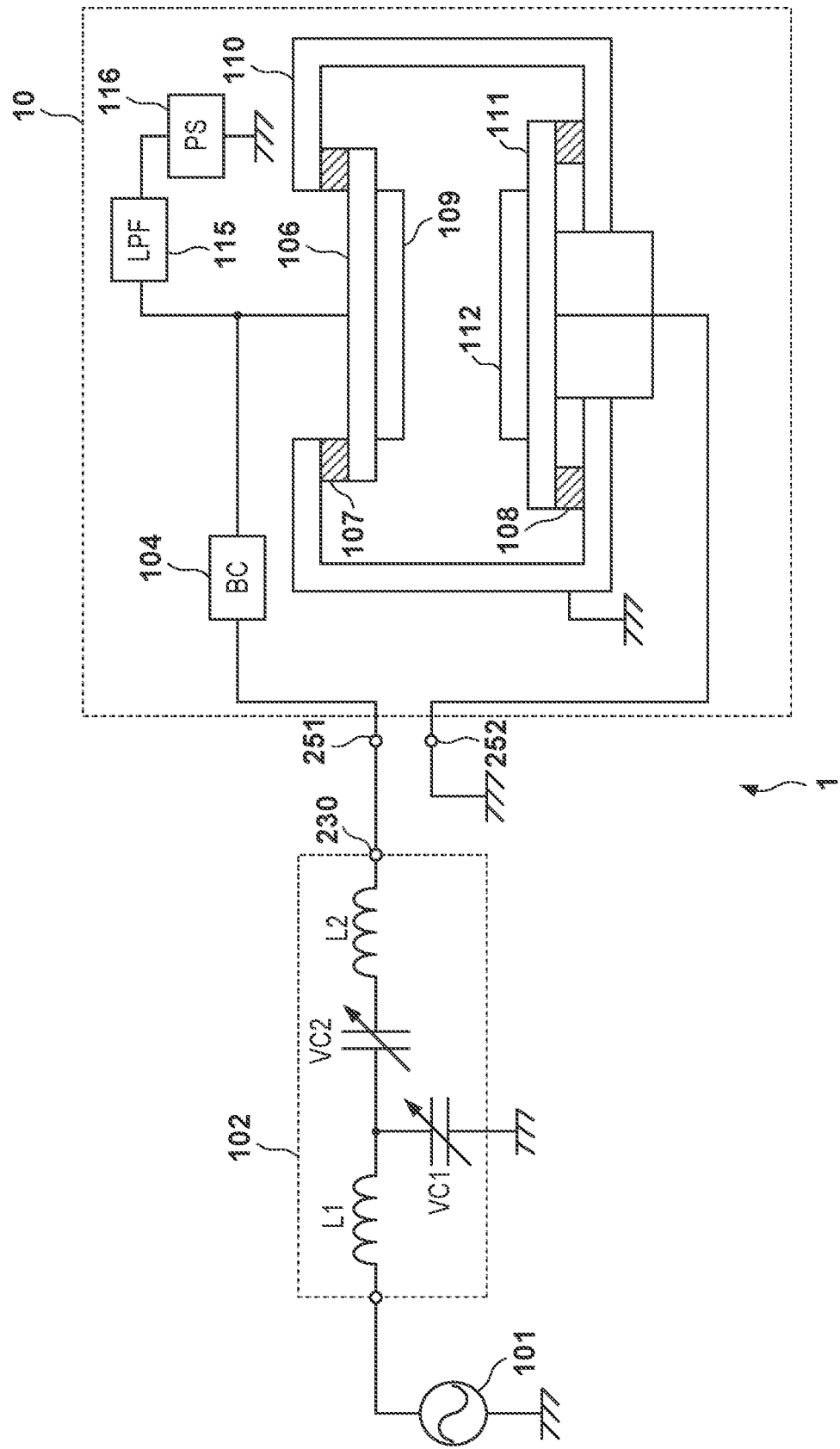
FIG. 7 is a circuit diagram exemplifying a method of confirming $Rp-jXp$.

A method of deciding Rp−jXp (it is desired to actually know only Rp) will be exemplified with reference to FIG. 7. The balun 103 is detached from the plasma processing apparatus 1 and an output terminal 230 of the impedance matching circuit 102 is connected to the first terminal 251 (blocking capacitor 104) of the main body 10. Furthermore, the second terminal 252 (second electrode 111) of the main body 10 is grounded. In this state, the high-frequency power supply 101 supplies a high frequency to the first terminal 251 of the main body 10 via the impedance matching circuit 102. In the example shown in FIG. 7, the impedance matching circuit 102 is equivalently formed by coils L1 and L2 and variable capacitors VC1 and VC2. It is possible to generate plasma by adjusting the capacitance values of the variable capacitors VC1 and VC2. In the state in which the plasma is stable, the impedance of the impedance matching circuit 102 matches the impedance Rp−jXp on the side of the main body 10 (the side of the first electrode 106 and the second electrode 111) when the plasma is generated. The impedance of the impedance matching circuit 102 at this time is given by Rp+jXp. Therefore, Rp−jXp (it is desired to actually know only Rp) can be obtained based on the impedance Rp+jXp of the impedance matching circuit 102 when the impedance is matched. Alternatively, for example, Rp−jXp can be obtained by simulation based on design data.

Based on Rp obtained in this way, the reactance component (inductance component) X of the impedance of the first coil 221 of the balun 103 is decided so as to satisfy $1.5 \leq X/Rp \leq 5000$. By deciding the reactance component of the balun 103 as described above, it is possible to stabilize the plasma potential (and the self-bias voltage (the surface voltage of the target 109)) even if no power supply 116 is provided.

Furthermore, in the arrangement in which the power supply 116 supplies a negative DC voltage to the first electrode 106 via the low-pass filter 115, it is possible to control the surface voltage of the target 109 by the DC voltage. On the other hand, in the arrangement in which the power supply 116 supplies an AC voltage to the first electrode 106 via the low-pass filter 115, it is possible to control, by the AC voltage, ion energy colliding against the surface of the target 109. Therefore, the power of the high frequency supplied between the first electrode 106 and the second electrode 111 from the high-frequency power supply 101 can be adjusted independently of the surface voltage of the target 109. Furthermore, in the arrangement in which the power supply 116 supplies a negative DC voltage or an AC voltage to the first electrode 106 via the low-pass filter 115, it is possible to make the plasma potential insensitive to the state of the inner surface of the vacuum container 110. Therefore, it is not always necessary to satisfy $1.5 \leq X/Rp \leq 5000$. Even if $1.5 \leq X/Rp \leq 5000$ is not satisfied, the practical performance can be provided.

The relationship between the size of the first electrode 106 and that of the second electrode 111 is not limited. However, the first electrode 106 and the second electrode 111 preferably have similar sizes. In this case, the self-bias voltage can be made low, and the surface voltage of the target 109 or ion energy colliding against the surface of the target 109 can be freely controlled by the power supply 116.

Figure 8:
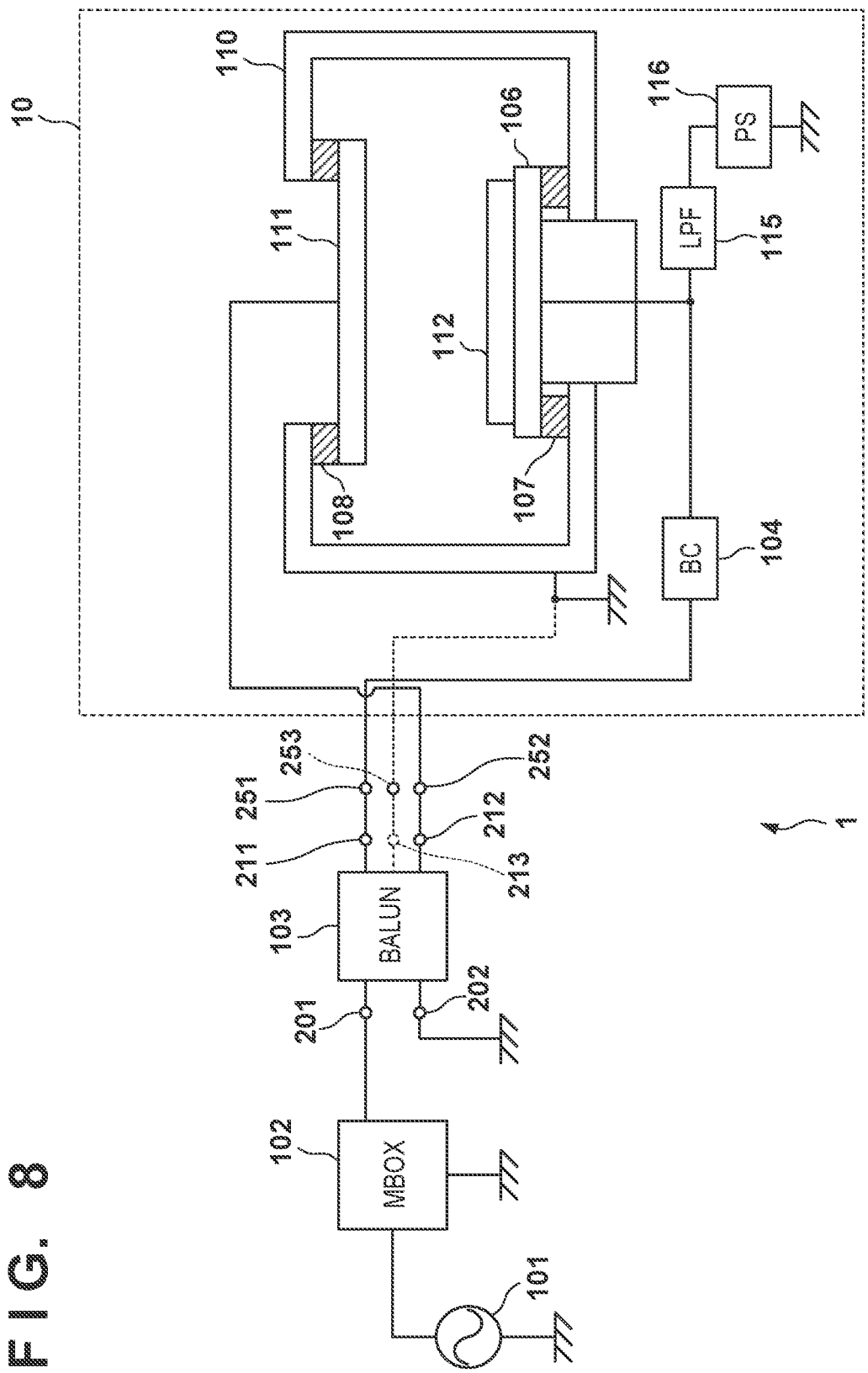
FIG. 8 is a circuit diagram schematically showing the arrangement of a plasma processing apparatus according to the second embodiment of the present invention.

FIG. 8 schematically shows the arrangement of a plasma processing apparatus 1 according to the second embodiment of the present invention. The plasma processing apparatus 1 according to the second embodiment can operate as an etching apparatus that etches a substrate 112. In the second embodiment, a first electrode 106 serves as a cathode, and holds the substrate 112. In the second embodiment, a second electrode 111 serves as an anode. In the plasma processing apparatus 1 according to the second embodiment, the first electrode 106 and a first balanced terminal 211 are electrically connected via a blocking capacitor 104. In other words, in the plasma processing apparatus 1 according to the second embodiment, the blocking capacitor 104 is arranged in an electrical connection path between the first electrode 106 and the first balanced terminal 211.

Figure 9:
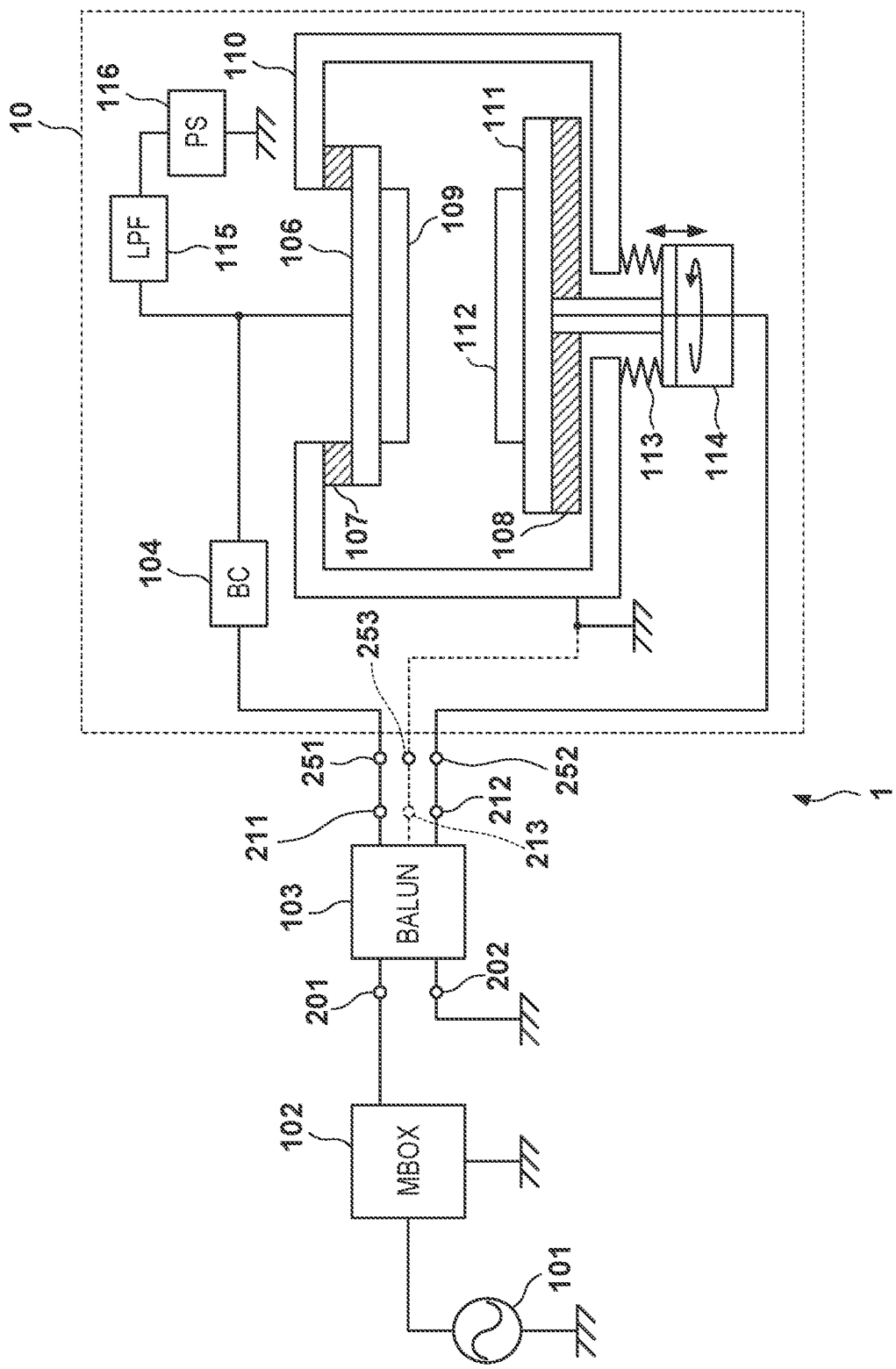
FIG. 9 is a circuit diagram schematically showing the arrangement of a plasma processing apparatus according to the third embodiment of the present invention.

FIG. 9 schematically shows the arrangement of a plasma processing apparatus 1 according to the third embodiment of the present invention. The plasma processing apparatus 1 according to the third embodiment is a modification of the plasma processing apparatus 1 according to the first embodiment, and further includes at least one of a mechanism for vertically moving a second electrode 111 and a mechanism for rotating the second electrode 111. In the example shown in FIG. 9, the plasma processing apparatus 1 includes a driving mechanism 114 having both the mechanism for vertically moving the second electrode 111 and the mechanism for rotating the second electrode 111. A bellows 113 forming a vacuum partition can be provided between a vacuum container 110 and the driving mechanism 114. Similarly, the plasma processing apparatus 1 according to the second embodiment can further include at least one of a mechanism for vertically moving the second electrode 111 and a mechanism for rotating the second electrode 111.

In the third embodiment as well, the relationship between the size of a first electrode 106 and that of the second electrode 111 is not limited. However, the first electrode 106 and the second electrode 111 preferably have similar sizes.

Figure 10:
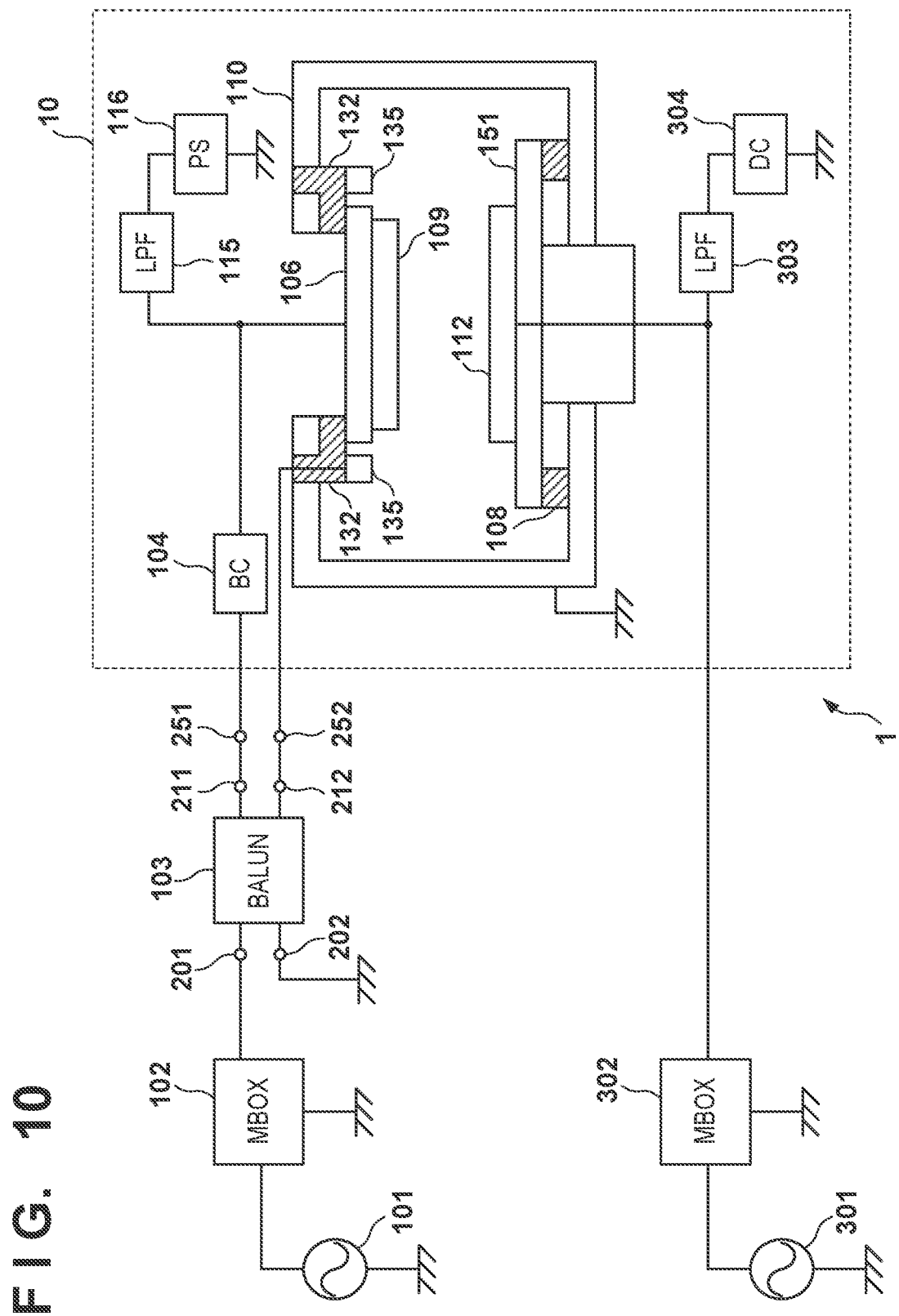
FIG. 10 is a circuit diagram schematically showing the arrangement of a plasma processing apparatus according to the fourth embodiment of the present invention.

FIG. 10 schematically shows the arrangement of a plasma processing apparatus 1 according to the fourth embodiment of the present invention. Items which are not referred to as the plasma processing apparatus 1 according to the fourth embodiment can comply with the first to third embodiments. The plasma processing apparatus 1 includes a balun 103, a vacuum container 110, a first electrode 106, a second electrode 135, a third electrode 151, low-pass filters 115 and 303, a power supply 116, and a DC power supply 304. Alternatively, it may be understood that the plasma processing apparatus 1 includes the balun 103 and a main body 10, and the main body 10 includes the vacuum container 110, the first electrode 106, the second electrode 135, the third electrode 151, the low-pass filters 115 and 303, the power supply 116, and the DC power supply 304. The main body 10 includes a first terminal 251 and a second terminal 252. The plasma processing apparatus 1 can further include impedance matching circuits 102 and 302 and high-frequency power supplies 101 and 301. The power supply 116 can be, for example, a DC power supply or an AC power supply. The DC power supply may generate a DC voltage with an AC component.

The balun 103 includes a first unbalanced terminal 201, a second unbalanced terminal 202, a first balanced terminal 211, and a second balanced terminal 212. An unbalanced circuit is connected to the first unbalanced terminal 201 and the second unbalanced terminal 202 of the balun 103, and a balanced circuit is connected to the first balanced terminal 211 and the second balanced terminal 212 of the balun 103. The balun 103 may further include a midpoint terminal, as described above. The midpoint terminal can electrically be connected to the vacuum container 110.

The first electrode 106 holds a target 109. The target 109 can be, for example, an insulator material or a conductor material. The second electrode 135 is arranged around the first electrode 106. The first electrode 106 is electrically connected to the first balanced terminal 211 of the balun 103, and the second electrode 135 is electrically connected to the second balanced terminal 212 of the balun 103. The third electrode 151 holds a substrate 112. The third electrode 151 can be supplied with a high frequency from the high-frequency power supply 301 via the impedance matching circuit 302.

The above arrangement can be understood as an arrangement in which the first electrode 106 is electrically connected to the first terminal 251, the second electrode 135 is electrically connected to the second terminal 252, the first terminal 251 is electrically connected to the first balanced terminal 211 of the balun 103, and the second terminal 252 is electrically connected to the second balanced terminal 212 of the balun 103.

The first electrode 106 and the first balanced terminal 211 (first terminal 251) can electrically be connected via a blocking capacitor 104. The blocking capacitor 104 blocks a DC current or an AC current from the power supply 116 between the first balanced terminal 211 of the balun 103 and the first electrode 106 (or between the first balanced terminal 211 and the second balanced terminal 212 of the balun 103). Instead of providing the blocking capacitor 104, the impedance matching circuit 102 may be configured to block a DC current or an AC current flowing between the first unbalanced terminal 201 and the second unbalanced terminal 202 from the power supply 116. Alternatively, the blocking capacitor 104 may be arranged between the second electrode 135 and the second balanced terminal 212 (second terminal 252). The first electrode 106 and the second electrode 135 can be supported by the vacuum container 110 via an insulator 132.

The high-frequency power supply 101 supplies a high frequency between the first unbalanced terminal 201 and the second unbalanced terminal 202 of the balun 103 via the impedance matching circuit 102. In other words, the high-frequency power supply 101 supplies a high frequency between the first electrode 106 and the second electrode 135 via the first impedance matching circuit 102, the balun 103, and the blocking capacitor 104. Alternatively, the high-frequency power supply 101 supplies a high frequency between the first terminal 251 and the second terminal 252 of the main body 10 via the impedance matching circuit 102 and the balun 103. The high-frequency power supply 301 supplies a high frequency to the third electrode 151 via the impedance matching circuit 302.

The power supply 116 supplies a negative DC voltage (bias voltage) or an AC voltage to the first electrode 106 via the low-pass filter 115. The low-pass filter 115 blocks a high frequency supplied from the balun 103 so as not to be transmitted to the power supply 116. By supplying a negative DC voltage from the power supply 116 to the first electrode 106, it is possible to control the voltage of the surface of the target 109. By supplying an AC voltage from the power supply 116 to the first electrode 106, it is possible to control ion energy colliding against the surface of the target 109. The DC power supply 304 supplies a DC voltage (bias voltage) to the third electrode 151 via the low-pass filter 303. The low-pass filter 303 blocks a high frequency supplied from the high-frequency power supply 301 so as not to be transmitted to the DC power supply 304. When the DC power supply 304 supplies a DC voltage to the third electrode 151, it is possible to control the surface potential of the substrate 112.

In the fourth embodiment as well, by supplying a negative DC voltage or an AC voltage from the power supply 116 to the first electrode 106, it is possible to control the voltage of the surface of the target 109 or ion energy colliding against the target 109, thereby controlling a plasma density by the high-frequency power supply 101 and the high-frequency power supply 301. In addition, in the fourth embodiment as well, satisfying $1.5 \leq X/Rp \leq 5000$ is advantageous in more stabilizing the plasma potential.

In the fourth embodiment as well, the relationship between the size of the first electrode 106 and that of the second electrode 135 is not limited. However, the first electrode 106 and the second electrode 135 preferably have similar sizes.

Figure 11:
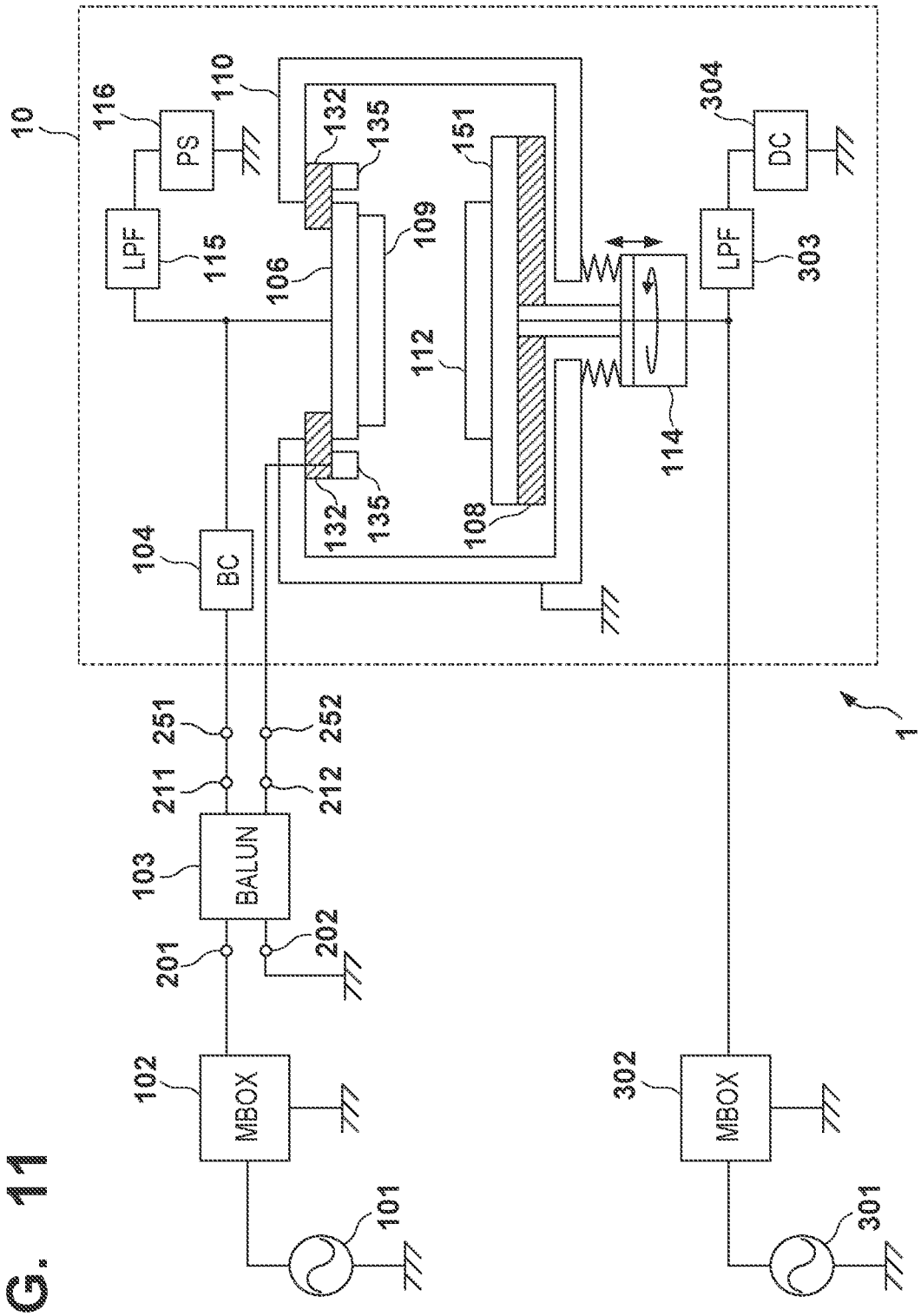
FIG. 11 is a circuit diagram schematically showing the arrangement of a plasma processing apparatus according to the fifth embodiment of the present invention.

FIG. 11 schematically shows the arrangement of a plasma processing apparatus 1 according to the fifth embodiment of the present invention. The plasma processing apparatus 1 according to the fifth embodiment has an arrangement obtained by adding a driving mechanism 114 to the plasma processing apparatus 1 according to the fourth embodiment. The driving mechanism 114 can include at least one of a mechanism for vertically moving a third electrode 151 and a mechanism for rotating the third electrode 151.

In the fifth embodiment as well, the relationship between the size of a first electrode 106 and that of a second electrode 135 is not limited. However, the first electrode 106 and the second electrode 135 preferably have similar sizes.

Figure 12:
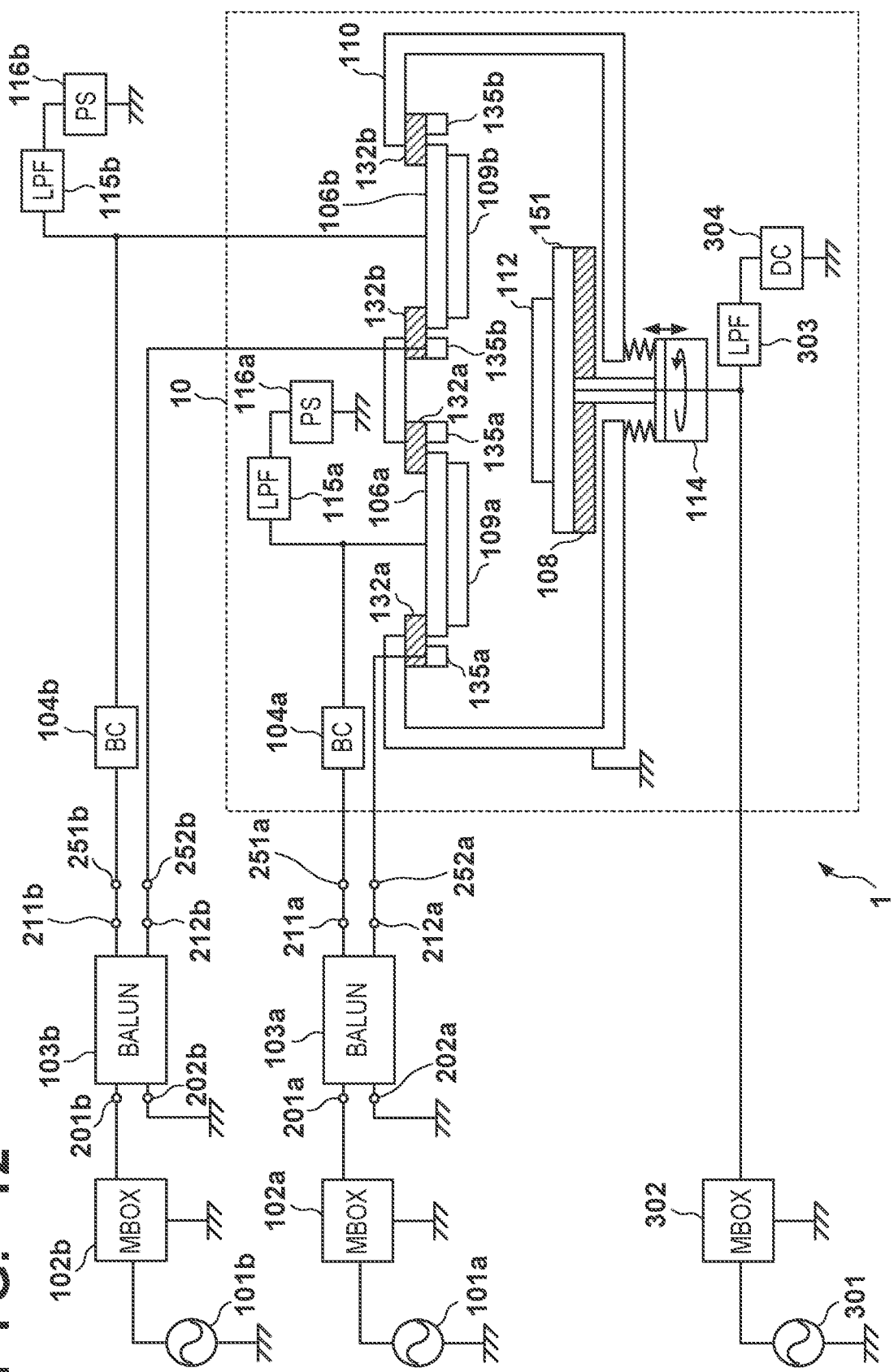
FIG. 12 is a circuit diagram schematically showing the arrangement of a plasma processing apparatus according to the sixth embodiment of the present invention.

FIG. 12 schematically shows the arrangement of a plasma processing apparatus 1 according to the sixth embodiment of the present invention. Items which are not referred to as the sixth embodiment can comply with the first to fifth embodiments. The plasma processing apparatus 1 according to the sixth embodiment includes a plurality of first high-frequency supply units and at least one second high-frequency supply unit. An example in which the plurality of first high-frequency supply units are formed by two high-frequency supply units will be described. In addition, the two high-frequency supply units and constituent elements associated with them are distinguished from each other using subscripts a and b. Similarly, two targets are distinguished from each other using subscripts a and b.

One of the plurality of first high-frequency supply units can include a first electrode 106a, a second electrode 135a, a balun 103a, a power supply 116a, a low-pass filter 115a, a high-frequency power supply 101a, an impedance matching circuit 102a, and a blocking capacitor 104a. Another one of the plurality of first high-frequency supply units can include a first electrode 106b, a second electrode 135b, a balun 103b, a power supply 116b, a low-pass filter 115b, a high-frequency power supply 101b, an impedance matching circuit 102b, and a blocking capacitor 104b. The second high-frequency supply unit can include a high-frequency power supply 301, an impedance matching circuit 302, a DC power supply 304, and a low-pass filter 303. Each of the power supplies 116a and 116b can be, for example, a DC power supply or an AC power supply. The DC power supply may generate a DC voltage with an AC component.

From another viewpoint, the plasma processing apparatus 1 includes the baluns 103a and 103b, a vacuum container 110, the first electrodes 106a and 106b, the second electrodes 135a and 135b, a third electrode 151, the low-pass filters 115a, 115b, and 303, the power supplies 116a and 116b, the DC power supply 304, and the high-frequency power supplies 101a, 101b, and 301.

The balun 103a includes a first unbalanced terminal 201a, a second unbalanced terminal 202a, a first balanced terminal 211a, and a second balanced terminal 212a. An unbalanced circuit is connected to the first unbalanced terminal 201a and the second unbalanced terminal 202a of the balun 103a, and a balanced circuit is connected to the first balanced terminal 211a and the second balanced terminal 212a of the balun 103a. The balun 103b includes a first unbalanced terminal 201b, a second unbalanced terminal 202b, a first balanced terminal 211b, and a second balanced terminal 212b. An unbalanced circuit is connected to the first unbalanced terminal 201b and the second unbalanced terminal 202b of the balun 103b, and a balanced circuit is connected to the first balanced terminal 211b and the second balanced terminal 212b of the first balun 103b.

The first electrodes 106a and 106b hold targets 109a and 109b, respectively. Each of the targets 109a and 109b can be, for example, an insulator material or a conductor material. The second electrodes 135a and 135b are arranged around the first electrodes 106a and 106b, respectively. The first electrodes 106a and 106b are electrically connected to the first balanced terminals 211a and 211b of the baluns 103a and 103b, respectively, and the second electrodes 135a and 135b are electrically connected to the second balanced terminals 212a and 212b of the first baluns 103a and 103b, respectively. The high-frequency power supply 101a supplies a high frequency (high-frequency current, high-frequency voltage, and high-frequency power) between the first unbalanced terminal 201a and the second unbalanced terminal 202a of the balun 103a via the impedance matching circuit 102a. The high-frequency power supply 101b supplies a high frequency (high-frequency current, high-frequency voltage, and high-frequency power) between the first unbalanced terminal 201b and the second unbalanced terminal 202b of the balun 103b via the impedance matching circuit 102b. The third electrode 151 holds a substrate 112. The third electrode 151 can be supplied with a high frequency from the high-frequency power supply 301 via the impedance matching circuit 302.

The power supplies 116a and 116b supply negative DC voltages (bias voltages) or AC voltages to the first electrodes 106a and 106b via the low-pass filters 115a and 115b, respectively. The low-pass filters 115a and 115b block high frequencies supplied from the baluns 103a and 103b so as not to be transmitted to the power supplies 116a and 116b, respectively. By supplying negative DC voltages from the power supplies 116a and 116b to the first electrodes 106a and 106b, it is possible to control the voltages of the surfaces of the targets 109a an 109b, respectively. By supplying AC voltages from the power supplies 116a and 116b to the first electrodes 106a and 106b, it is possible to control ion energy colliding against the surfaces of the targets 109a and 109b, respectively. The DC power supply 304 supplies a DC voltage (bias voltage) to the third electrode 151 via the low-pass filter 303. The low-pass filter 303 blocks a high frequency supplied from the high-frequency power supply 301 so as not to be transmitted to the DC power supply 304. When the DC power supply 304 supplies a DC voltage to the third electrode 151, it is possible to control the surface potential of the substrate 112.

Each of the first high-frequency supply unit and the second high-frequency supply unit can be represented by an equivalent circuit similar to that shown in FIG. 3. In the sixth embodiment as well, it is preferable to satisfy $1.5 \leq X/Rp \leq 5000$.

In the sixth embodiment as well, the relationship between the size of the first electrode 106a and that of the second electrode 135a is not limited. However, the first electrode 106a and the second electrode 135a preferably have similar sizes. Similarly, the relationship between the size of the first electrode 106b and that of the second electrode 135b is not limited. However, the first electrode 106b and the second electrode 135b preferably have similar sizes.

The present invention is not limited to the above-described embodiments, and various changes and modifications can be made within the spirit and scope of the present invention. Therefore, to apprise the public of the scope of the present invention, the following claims are made.

REFERENCE SIGNS LIST

1: plasma processing apparatus, 10: main body, 101: high-frequency power supply, 102: impedance matching circuit, 103: balun, 104: blocking capacitor, 106: first electrode, 107, 108: insulator, 109: target, 110: vacuum container, 111: second electrode, 112: substrate, 115: low-pass filter, 116: power supply, 201: first unbalanced terminal, 202: second unbalanced terminal, 211: first balanced terminal, 212: second balanced terminal, 213: midpoint terminal, 251: first terminal, 252: second terminal, 253: third terminal, 221: first coil, 222: second coil, 223: third coil, 224: fourth coil

The invention claimed is:

1. A plasma processing apparatus comprising:
a balun including a first unbalanced terminal, a second unbalanced terminal, a first balanced terminal, and a second balanced terminal;

a grounded vacuum container formed by a conductor;
a first electrode electrically connected to the first balanced terminal;
a second electrode electrically connected to the second balanced terminal;
an impedance matching circuit;
a first power supply connected to the balun via the impedance matching circuit, and configured to supply a high frequency to the first electrode via the impedance matching circuit and the balun;
a low-pass filter; and
a second power supply configured to supply a voltage to the first electrode via the low-pass filter;
wherein the balun includes a first coil configured to connect the first unbalanced terminal and the first balanced terminal, and a second coil configured to connect the second unbalanced terminal and the second balanced terminal.

2. The plasma processing apparatus according to claim 1, wherein the first electrode holds a target, and the second electrode holds a substrate.

3. The plasma processing apparatus according to claim 1, wherein the balun further includes a third coil and a fourth coil both of which are connected between the first balanced terminal and the second balanced terminal, and the third coil and the fourth coil are configured to set, as a midpoint between a voltage of the first balanced terminal and a voltage of the second balanced terminal, a voltage of a connection node of the third coil and the fourth coil.

4. The plasma processing apparatus according to claim 3, wherein the connection node is connected to the vacuum container.

5. The plasma processing apparatus according to claim 1 wherein
the second power supply includes an AC power supply, and
a frequency of a voltage supplied from the AC power supply to the first electrode is lower than the frequency.

6. The plasma processing apparatus according to claim 1 wherein the first electrode is supported by the vacuum container via an insulator.

7. The plasma processing apparatus according to claim 1, wherein an insulator is arranged between the second electrode and the vacuum container.

8. The plasma processing apparatus according to claim 1, further comprising at least one of a mechanism configured to vertically move the second electrode and a mechanism configured to rotate the second electrode.

9. The plasma processing apparatus according to claim 1, wherein the first electrode holds a substrate, and the plasma processing apparatus is configured as an etching apparatus.

10. The plasma processing apparatus according to claim 1, wherein the first electrode holds a target, and the second electrode is arranged around the first electrode.

11. The plasma processing apparatus according to claim 1, wherein
a plurality of high-frequency supply units are provided, and each of the plurality of high-frequency supply units includes the balun, the first electrode, and the second electrode, and
the first electrode of each of the plurality of high-frequency supply units holds a target and, in each of the plurality of high-frequency supply units, the second electrode is arranged around the first electrode.

12. The plasma processing apparatus according to claim 10, wherein the first electrode and the second electrode are supported by the vacuum container via an insulator.

13. The plasma processing apparatus according to claim 10, further comprising:
a third electrode configured to hold a substrate; and
a second high-frequency power supply configured to supply a high frequency to the third electrode via a second impedance matching circuit.

14. The plasma processing apparatus according to claim 13, further comprising:
a second DC power supply configured to supply a DC voltage to the third electrode via a second low-pass filter.

15. The plasma processing apparatus according to claim 13, wherein an insulator is arranged between the third electrode and the vacuum container.

16. The plasma processing apparatus according to claim 13, further comprising at least one of a mechanism configured to vertically move the third electrode and a mechanism configured to rotate the third electrode.

17. The plasma processing apparatus according to claim 1, wherein the first balanced terminal and the first electrode are electrically connected via a blocking capacitor.

18. The plasma processing apparatus according to claim 1, wherein the second balanced terminal and the second electrode are electrically connected via a blocking capacitor.

19. The plasma processing apparatus according to claim 1, wherein when Rp represents a resistance component between the first balanced terminal and the second balanced terminal when viewing a side of the first electrode and the second electrode from a side of the first balanced terminal and the second balanced terminal, and X represents an inductance between the first unbalanced terminal and the first balanced terminal, $1.5 \leq X/Rp \leq 5000$ is satisfied.

20. The plasma processing apparatus according to claim 1, wherein a part of a current flowing through the first coil flows to ground through the grounded vacuum container.

* * * * *